US012586880B2

(12) United States Patent
Saleh et al.

(10) Patent No.: US 12,586,880 B2
(45) Date of Patent: Mar. 24, 2026

(54) BROADBAND SWITCH FOR 3T AND 7T MAGNETIC RESONANCE IMAGING

(71) Applicant: Imam Abdulrahman Bin Faisal University, Dammam (SA)

(72) Inventors: Gameel Saleh Mohammed Saleh, Dammam (SA); Ashraf Abuelhaija, Dammam (SA)

(73) Assignee: Imam Abdulrahman Bin Faisal University, Dammam (SA)

( * ) Notice: Subject to any disclaimer, the term of this patent is extended or adjusted under 35 U.S.C. 154(b) by 198 days.

(21) Appl. No.: 18/616,521

(22) Filed: Mar. 26, 2024

(65) Prior Publication Data

US 2025/0309512 A1 Oct. 2, 2025

(51) Int. Cl.
| | |
|---|---|
| *H01P 1/203* | (2006.01) |
| *G01R 33/00* | (2006.01) |
| *H01P 5/18* | (2006.01) |

(52) U.S. Cl.
CPC .......... *H01P 1/203* (2013.01); *G01R 33/0058* (2013.01); *H01P 5/185* (2013.01)

(58) Field of Classification Search
CPC . H01P 1/203; H01P 5/18; H01P 5/185; G01R 33/00; G01R 33/0058; G01R 33/36; G01R 33/3642; G01R 33/341; G01R 33/343; G01R 33/3614
See application file for complete search history.

(56) References Cited

U.S. PATENT DOCUMENTS

| | | | |
|---|---|---|---|
| 2004/0266362 A1 | 12/2004 | Watkins et al. | |
| 2009/0295497 A1* | 12/2009 | Dowling | H03H 7/383 333/33 |
| 2011/0115483 A1 | 5/2011 | Zhai et al. | |
| 2015/0362569 A1 | 12/2015 | Kaggie et al. | |

(Continued)

FOREIGN PATENT DOCUMENTS

| | | | | |
|---|---|---|---|---|
| CN | 108448221 A | * | 8/2018 | H01P 5/18 |

OTHER PUBLICATIONS

Abuelhaija et al. ; Two-section branch-line hybrid couplers based broadband transmit/receive switch ; International Journal of Electrical and Computer Engineering (IJECE), vol. 13, No. 3 ; Oct. 1, 2022 ; 8 Pages.

(Continued)

*Primary Examiner* — Son T Le
(74) *Attorney, Agent, or Firm* — Oblon, McClelland, Maier & Neustadt, L.L.P.

(57) ABSTRACT

A hybrid microstripline transmit/receive switch and methods for use in magnetic resonance imaging of X-atomic nuclei at 3T and 7T magnetic field strengths. A first and second dielectric substrate each include a broadband hybrid magnetic coupler formed on the top side and a ground plane formed on the bottom side. An RF electrical signal is input to a first port and a second port transmits the signal when a first pin diode and a second pin diode are forward biased. A third port is isolated and a fourth port receives signals when the first and second pin diodes are reversed biased. Tuning capacitors are connected to the ports. The T/R switch is configured to operate in broadband frequency ranges of about 25 MHz to about 55 MH, of about 61 MHz to about 128 MHz, and of about 250 MHz to about 317 MHz.

20 Claims, 14 Drawing Sheets

(56)     References Cited

U.S. PATENT DOCUMENTS

2018/0310857 A1*  11/2018  Pusa ................ G01R 33/34007
2022/0365153 A1    11/2022  Abuelhaija et al.

OTHER PUBLICATIONS

Choi et al. ; Design and construction of a novel 1H/19F double-tuned coil system using PIN-diode switches at 9.4T ; Journal of Magnetic Resonance, vol. 279 ; 7 Pages.
Chiu et al. ; Wideband parallel-strip 90 degree hybrid couplerwith swap ; Electronics Letters, vol. 44, No. 11 ; May 22, 2008 ; 2 Pages.

* cited by examiner

1500 ⌐

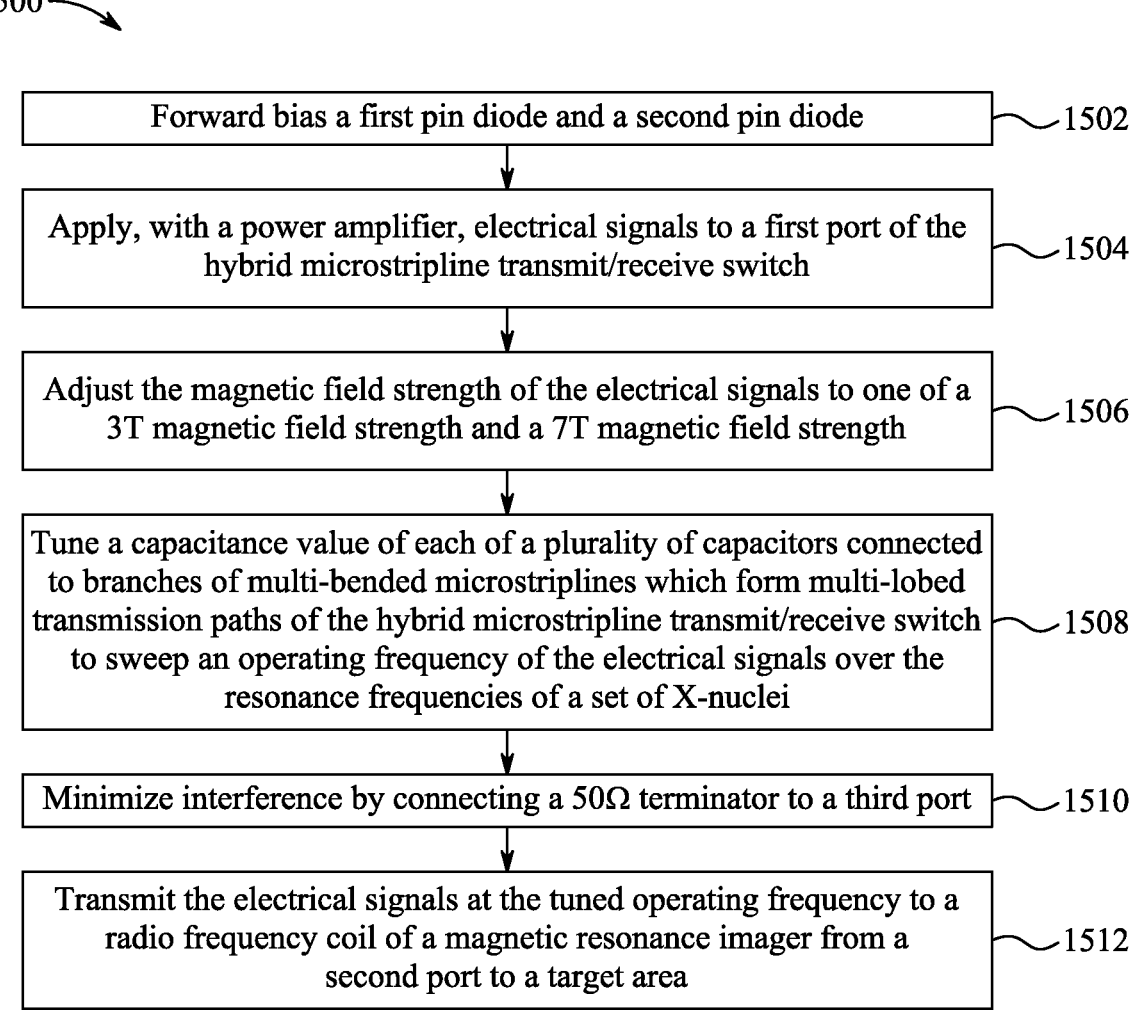

Forward bias a first pin diode and a second pin diode    1502

Apply, with a power amplifier, electrical signals to a first port of the hybrid microstripline transmit/receive switch    1504

Adjust the magnetic field strength of the electrical signals to one of a 3T magnetic field strength and a 7T magnetic field strength    1506

Tune a capacitance value of each of a plurality of capacitors connected to branches of multi-bended microstriplines which form multi-lobed transmission paths of the hybrid microstripline transmit/receive switch to sweep an operating frequency of the electrical signals over the resonance frequencies of a set of X-nuclei    1508

Minimize interference by connecting a 50Ω terminator to a third port    1510

Transmit the electrical signals at the tuned operating frequency to a radio frequency coil of a magnetic resonance imager from a second port to a target area    1512

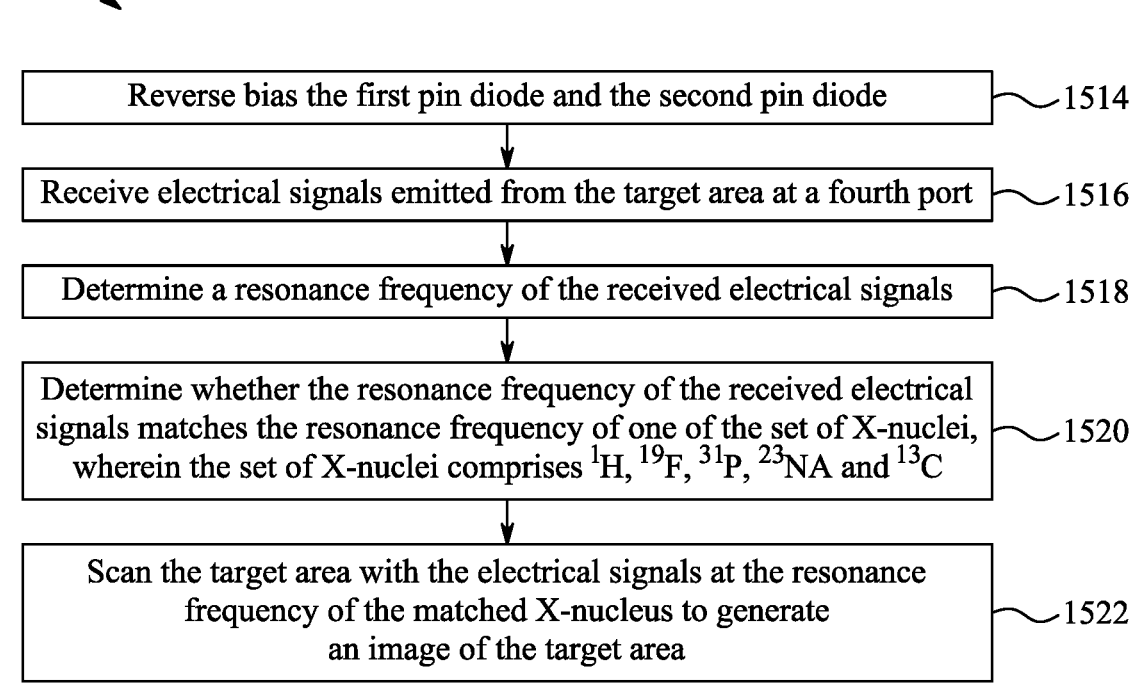

Reverse bias the first pin diode and the second pin diode          1514

Receive electrical signals emitted from the target area at a fourth port          1516

Determine a resonance frequency of the received electrical signals          1518

Determine whether the resonance frequency of the received electrical signals matches the resonance frequency of one of the set of X-nuclei, wherein the set of X-nuclei comprises $^{1}H$, $^{19}F$, $^{31}P$, $^{23}NA$ and $^{13}C$          1520

Scan the target area with the electrical signals at the resonance frequency of the matched X-nucleus to generate an image of the target area          1522

FIG. 15B

BROADBAND SWITCH FOR 3T AND 7T MAGNETIC RESONANCE IMAGING

CROSS REFERENCE TO RELATED APPLICATIONS

The present application is related to "¹H Transmit/Receive Switch for 3T and 7T Magnetic Resonance Imaging", U.S. application Ser. No. 18/423,792 having a filing date of Jan. 26, 2024, which is incorporated herein by reference in its entirety.

STATEMENT REGARDING PRIOR DISCLOSURE BY THE INVENTORS

Aspects of this technology are described in an article "Two-Section Branch-Line Hybrid Couplers Based Broadband Transmit/Receive Switch", published in June 2023, by the International Journal of Electrical and Computer Engineering (IJECE). Vol. 13. pp. 2600-2607, which is incorporated herein by reference in its entirety.

BACKGROUND

Technical Field

The present disclosure is directed to a broadband switch transmit/receive switch for 3T and 7T magnetic resonance imaging.

Description of the Related Art

The "background" description provided herein is for the purpose of generally presenting the context of the disclosure. Work of the presently named inventors, to the extent described in this background section, as well as aspects of the description which may not otherwise qualify as prior art at the time of filing, are neither expressly or impliedly admitted as prior art against the present invention.

Due to the growing interest in high-speed wireless communication, the demand for ultra-wideband (UWB) technology and devices has increased. The conventional quadrature hybrid coupler demonstrates only narrowband characteristics. Developments in the field of couplers for magnetic resonance applications have been presented in recent years to try to extend the bandwidth. For example, a two-section wideband hybrid coupler using a short-circuited parallel-coupled 3-line was described which has 55% fractional bandwidth (FBW) under the specifications limited by 1 decibel (dB) power imbalance, 20.1 dB return loss, 20.8 dB isolation, and 3.2° phase imbalance. (See: H J. Yoon and B W. Min, "Two section wideband 90° hybrid coupler using parallel-coupled three-line". IEEE microwave and wireless components letters, vol. 27, no. 6, 2017).

A hybrid coupler using a tandem connection demonstrated 38% FBW under the specifications limited by 0.6 dB power imbalance, 25 dB return loss, and 32 dB isolation. (See: A. Jain, RP. Yadav and SV. Kulkarni, "Design and development of 2 kW, 3 dB hybrid coupler for the prototype Ion Cyclotron Resonance Frequency (ICRF) system," International Journal of Microwave and Wireless Technologies, vol. 11, no. 1, 2019).

In the same context of the tandem coupler, a UWB hybrid coupler uses the tandem connection of two 8.3 dB multi-section couplers. The UWB hybrid coupler covers the frequency range from 1 GHz to 10 GHz. It was designed under the specifications limited by ±1.5 dB amplitude unbalance, ±7° phase imbalance and isolation and return loss better than 14 dB. (See: S M. Javadzadeh, S M. Majedi, F. Farzaneh, "Broadside coupler channels 1 to 10 GHz," Microwaves and RF, 2012).

In an ultra-wideband multi-layer 3 dB directional coupler, the operating frequency extends from 3.1 GHz to 10.6 GHz with coupling and insertion loss of 3.4 dB±1.1 dB. The isolation and return loss are more than 14 dB. (See: M. Leib, D. Mack, F. Thurow and W. Menzel, "Design of a multilayer ultra-wideband directional coupler," In German Microwave Conference, 2008).

A 3 dB UWB coupler using multilayer technology operating between 3.1 and 10.6 GHz was designed under the specifications limited by ±1.3 dB amplitude unbalance, 3.5° phase unbalance, 19 dB return loss, and 18 dB isolation (See: D N. Zaidel, et al., "A design of octagon-shaped 3-dB ultra wideband coupler using multilayer technology," Microwave and Optical Technology Letters, vol. 55, no. 1, 2013). However, none of the above cited references is able to operate at a subGHz frequency less than 298 MHz, as is needed to detect ¹H, ¹⁹F, ³¹P, ²³Na and ¹³C nuclei at 3T and 7T field strengths.

In US20220365153A1, in the field of transmit and receive switches for magnetic resonance imaging, the inventors described a simultaneous dual-tuned T/R switch to process a signal with two resonance frequencies from one dual resonant RF coil or two single resonant RF coils, simultaneously without tuning. However, this publication describes an outer loop shape surrounding the inner coupler in a nested configuration, unlike the hybrid coupler of the present disclosure.

Accordingly, it is one object of the present disclosure to provide a broadband transmit/receive switch for 3T and 7T magnetic resonance imaging which can detect magnetic resonance signals from a plurality of nuclei having resonant frequencies of less than about 320 KHz.

SUMMARY

In an exemplary embodiment, a broadband hybrid magnetic coupler for magnetic resonance imaging (MRI) of atomic nuclei is described. The broadband hybrid coupler includes a dielectric substrate having a top side and a bottom side, a first edge opposite to a second edge, and a third edge opposite to a fourth edge. A first central axis of the dielectric substrate is configured to bisect the first edge and the second edge and to extend from the first edge to the second edge and a second central axis of the dielectric substrate is configured to bisect the third edge and the fourth edge and to extend from the third edge to the fourth edge. The broadband hybrid coupler also includes a first port, a second port, a third port and a fourth port. Each port is configured to connect to a sub-miniature radio frequency (RF) connector located on the bottom side of the dielectric substrate. The broadband hybrid coupler also includes a multi-bended microstripline formed on the dielectric substrate. The multi-bended microstripline has six branches, including a first branch having a multi-bended structure extending between first port and the fourth port and between the third edge and the first central axis. The first branch includes a first straight leg connected to the first port, a second straight leg connected to the fourth port and a three lobed loop connected between the first straight leg and the second straight leg. The three lobed loop is centered about the second central axis. The multi-bended microstripline also includes a second branch extending between the first port and the second port, the second branch comprising a first straight leg connected to the first port, a second straight leg, a first four lobed loop connected between the first straight leg and the second straight leg, a third straight leg connected to the second port, and a second four lobed loop connected between the second straight leg and the third straight leg. The multi-bended microstripline also includes a third branch extending between the second port and the third port. The third branch is a mirror image of the first branch. The multi-bended microstripline also includes a fourth branch extending between the third port and the fourth port. The fourth branch is a mirror image of the second branch. The multi-bended microstripline also includes a phase inverter located at an intersection of the first central axis and the second central axis. The multi-bended microstripline also includes a fifth branch located between an intersection of the second branch with the first central axis and the phase inverter, the fifth branch comprising a straight leg connected to the second branch and a single lobed loop connected to the phase inverter. The single lobed loop extends from the first central axis towards the fourth edge, and the single lobed loop is centered about the second central axis. The multi-bended microstripline also includes a sixth branch located between an intersection of the fourth branch with the first central axis and the phase inverter, the sixth branch comprising a straight leg connected to the fourth branch and a single lobed loop connected to the phase inverter. The single lobed loop extends from the first central axis towards the third edge, and the single lobed loop is centered about the second central axis. Each of the microstripline of the first branch and the microstripline of the third branch have a width Wa. Each of the microstriplines of the second branch, the fourth branch, the fifth branch and the sixth branch have a width Wb, where the width Wb equals about seven times the width Wa. The multi-bended microstripline is configured to receive electrical signals at the first port and resonate the electrical signals at frequencies of about 95 MHz and about 285 MHz at the second port and at the fourth port. The frequencies at the fourth port are orthogonal to the frequencies at the second port, and the third port is isolated.

In another exemplary embodiment, a hybrid microstripline transmit/receive switch for use in magnetic resonance imaging (MRI) of X-atomic nuclei at 3T and 7T magnetic field strengths is described. A hybrid microstripline transmit/receive switch includes a first dielectric substrate and a second dielectric substrate. Each dielectric substrate includes a top side, a bottom side and four corners, a first edge opposite to a second edge, a third edge opposite to a fourth edge. A first central axis of each dielectric substrate is configured to bisect the first edge and the second edge and to extend from the first edge to the second edge and a second central axis of the dielectric substrate is configured to bisect the third edge and the fourth edge and to extend from the third edge to the fourth edge. The hybrid microstripline transmit/receive switch also includes a first broadband hybrid magnetic coupler formed on the top side of the first dielectric substrate. The first broadband hybrid magnetic coupler includes a first multi-bended microstripline. The hybrid microstripline transmit/receive switch also includes a first ground plane formed on the bottom side of the first dielectric substrate. The hybrid microstripline transmit/receive switch also includes a second broadband hybrid magnetic coupler formed on the top side of the second dielectric substrate. The second broadband hybrid magnetic coupler includes a second multi-bended microstripline. The second multi-bended microstripline is identical in configuration to the first multi-bended microstripline. The hybrid microstripline transmit/receive switch also includes a second ground plane formed on the bottom side of the second dielectric substrate. The second ground plane is attached to the first ground plane. Each multi-bended microstripline includes a first branch, a second branch, a third branch, a fourth branch, a fifth branch and a sixth branch. The fourth branch is a mirror image of the first branch about the second central axis, the third branch is a mirror image of the second branch about the first central axis, and the sixth branch is a mirror image of the fifth branch about the second central axis and a phase inverter connected between the fifth branch and the sixth branch of each multi-bended microstripline. The hybrid microstripline transmit/receive switch also includes a first port, a second port, a third port and a fourth port. The hybrid microstripline transmit/receive switch also includes a first terminal of a first branch of the first multi-bended microstripline connected to the first port. The hybrid microstripline transmit/receive switch also includes a second terminal of the first branch of the first multi-bended microstripline connected to a first terminal of a first branch of the second multi-bended microstripline. The hybrid microstripline transmit/receive switch also includes a first pin diode connected between the second terminal of the first branch of the first multi-bended microstripline and the first ground plane. The hybrid microstripline transmit/receive switch also includes a second terminal of the first branch of the second multi-bended microstripline connected to the fourth port. The hybrid microstripline transmit/receive switch also includes a first terminal of the second branch of the first multi-bended microstripline connected to the first port. The hybrid microstripline transmit/receive switch also includes a second terminal of the second branch of the first multi-bended microstripline connected to a first terminal of the fourth branch of the first multi-bended microstripline. The hybrid microstripline transmit/receive switch also includes a connector configured to connect the first terminal of the fourth branch of the first multi-bended microstripline with the second terminal of the fourth branch of the second multi-bended microstripline. The hybrid microstripline transmit/receive switch also includes a second pin diode connected between the first terminal of the fourth branch of the first multi-bended microstripline and the first ground plane. The hybrid microstripline transmit/receive switch also includes a first terminal of the third branch of the first multi-bended microstripline connected to a second terminal of the fourth branch of the first multi-bended microstripline. The hybrid microstripline transmit/receive switch also includes that the second port is connected to the second terminal of the fourth branch of the first multi-bended microstripline. The hybrid microstripline transmit/receive switch also includes a first terminal of the third branch of the second multi-bended microstripline connected to the second terminal of the fourth branch of the second multi-bended microstripline. The hybrid microstripline transmit/receive switch also includes a first terminal of the second branch of the second multi-bended microstripline is connected to the first terminal of the first branch of the second multi-bended microstripline. The hybrid microstripline transmit/receive switch also includes a second terminal of the second branch of the second multi-bended microstripline is connected to a first terminal of the fourth branch of the second multi-bended microstripline.

The hybrid microstripline transmit/receive switch also includes a third port that is connected to the first terminal of the fourth branch of the second multi-bended microstripline. The hybrid microstripline transmit/receive switch also includes a 50Ω terminator connected to the third port. The first port is configured to receive a pulsed radio frequency (RF) signal power input and transmit signals to the second port when the first pin diode and the second pin diode are forward biased and to receive signals at the fourth port at the 3T and 7T magnetic field strengths when the first pin diode and the second pin diode are reversed biased. The hybrid microstripline transmit/receive switch is configured to operate in a first broadband frequency range of about 25 MHz to about 55 MH, in a second broadband frequency range of about 61 MHz to about 128 MHz, and in a third broadband frequency range of about 250 MHz to about 317 MHz.

In another exemplary embodiment, a method of using a hybrid microstripline transmit/receive switch for magnetic resonance imaging (MRI) of X-atomic nuclei at 3 tesla (T) and 7T magnetic field strengths is described. The method includes in a transmission mode, forward biasing a first pin diode and a second pin diode. The method also includes applying, with a power amplifier, electrical signals to a first port of the hybrid microstripline transmit/receive switch. The method also includes adjusting the magnetic field strength of the electrical signals to one of a 3T magnetic field strength and a 7T magnetic field strength. The method also includes tuning a capacitance value of each of a plurality of capacitors connected to branches of multi-bended microstriplines which form multi-lobed transmission paths of the hybrid microstripline transmit/receive switch to sweep an operating frequency of the electrical signals over the resonance frequencies of a set of X-nuclei. The method also includes minimizing interference by connecting a 50Ω terminator to a third port. The method also includes transmitting the electrical signals at the tuned operating frequency, to a radio frequency coil of a magnetic resonance imager from a second port to a target area. The method also includes, in a reception mode, reverse biasing the first pin diode and the second pin diode. The method also includes receiving electrical signals emitted from the target area at a fourth port. The method also includes determining a resonance frequency of the received electrical signals. The method also includes determining whether the resonance frequency of the received electrical signals matches the resonance frequency of one of the set of X-nuclei. The set of X-nuclei includes $^1$H, $^{19}$F, $^{31}$P, $^{23}$Na and $^{13}$C. The method also includes scanning the target area with the electrical signals at the resonance frequency of the matched X-nucleus to generate an image of the target area.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein:

FIG. 15A depicts a flowchart of a method of using a hybrid microstripline transmit/receive switch 400 for magnetic resonance imaging (MRI) of X-atomic nuclei at 3 tesla (T) and 7T magnetic field strengths in a transmission mode, according to certain embodiments.

FIG. 15B depicts a flowchart of a method of using a hybrid microstripline transmit/receive switch 400 for magnetic resonance imaging (MRI) of X-atomic nuclei at 3 tesla (T) and 7T magnetic field strengths in a reception mode, according to certain embodiments.

DETAILED DESCRIPTION

Figure 1:
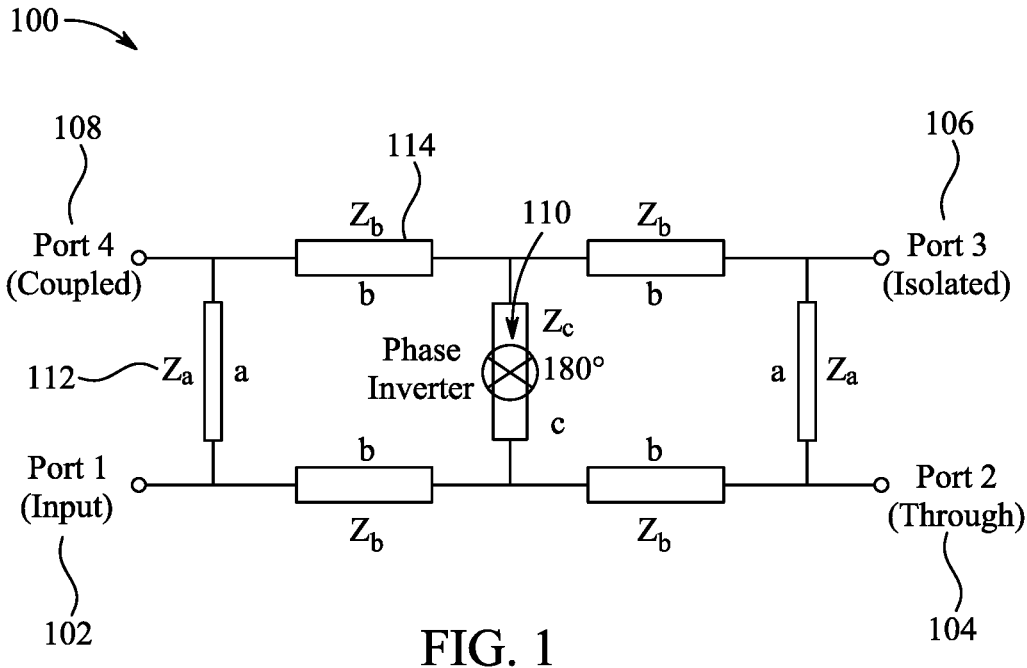
FIG. 1 depicts a schematic diagram of a two-section branch-line hybrid coupler, according to certain embodiments.

In the drawings, like reference numerals designate identical or corresponding parts throughout the several views. Further, as used herein, the words "a", "an" and the like generally carry a meaning of "one or more", unless stated otherwise.

Furthermore, the terms "approximately," "approximate", "about" and similar terms generally refer to ranges that include the identified value within a margin of 20%, 10%, or preferably 5%, and any values therebetween.

Magnetic resonance spectroscopy (MRS) is a tool for diagnosis of tumors and disease in clinical neurological practices. It measures the concentrations of specific chemicals in the body to help diagnose diseases in the brain and other cancerous tissue. Cancerous tissue can be characterized by metabolic alterations. For example, $^{13}$C (carbon 13) MRI examines the variations in the metabolism of organic molecules. These changes in biochemical processes serve as a marker for the presence of certain disorders. Prostate cancer, brain tumors, diabetes, lung injury, neuroinflamma-
tion, inflammatory arthritis, cardiovascular disease, and car-
diac metabolism are some of these illnesses. Specifically,
brain tumors are commonly detected by [31]P (Phosphorus 31)
assessment by a MRI scanner of phosphorous composition
and cellular energy. Breast cancer can be diagnosed by [23]Na
(Sodium 23) MRI, which detects changes in ion homeostasis
since the total concentration of sodium is notably greater in
malignant breasts than in healthy tissues. It also allows
visualization of tissue [23]Na concentration of patients with
lung cancer. The feasibility of a $^{31}$P MRI scan has been used
to image tongue cancer at 7T MRI. Hyperpolarized (HP)
carbon 13 ($^{13}$C) MRI is preferred both for initial diagnosis
and for monitoring the treatment of prostate cancer. X-nuclei
switches and coils enable physicians to study metabolism
and measure chemical transformations and can characterize
the development of tissue changes or the chemical conse-
quences related to disease progressions.

Various aspects of the present disclosure provide a broad-
band microstripline hybrid coupler-based transmit/receive
switch for 3T and 7T magnetic resonance imaging. The
broadband microstripline hybrid coupler-based transmit/re-
ceive switch operates within three ranges of frequencies to
cover the more strongly resonating X-atomic nuclei such as:
[1]H, $^{13}$C, $^{19}$F, [23]Na, and $^{31}$P at 3T (tesla) and 7T magnetic
field strength. For 7T application, the switch covers the
corresponding X-atomic nuclei frequencies within two
bands simultaneously. However, the coverage of the corre-
sponding X-atomic nuclei frequencies for 3T application
requires tuning. Tuning is necessary to obtain frequencies
lower than 60 megahertz (MHz).

The trace widths of the microstriplines for the switch have
been designed in order to avoid exceeding the allowable
amount of increase in temperature when being exposed to
the 1 kW power of the radio frequency pulses. The charac-
teristics of the switch have been obtained using a simulation
tool. In a non-limiting example, the simulation tool is the
Momentum tool (electromagnetic simulator) supported by
ADS software (See: "Momentum Key Features", available
from Keysight, 1400 Fountaingrove Parkway, Santa Rosa,
California, United States of America). The broadband
microstripline hybrid coupler-based transmit/receive switch
was fabricated and the measurement verification demon-
strated good return loss (>10 dB), high isolation (>40 dB),
low insertion loss (<0.8 dB) at all operating frequencies.

Aspects of this disclosure are directed to a transmit/
receive switch for magnetic resonance imaging of a [1]H
atomic nucleus at 3T and 7T magnetic field strengths,
including a hybrid coupler including a first coupler having a
microstripline with a meandering path configuration and a
second coupler having a microstripline with an identical
meandering path configuration. The first and second cou-
plers are separated by PIN diodes configured to switch
between a transmission and a reception state. The meander-
ing path of each coupler has mirror image geometry about
central bisecting axes. The T/R switch of the present dis-
closure has two mirror image couplers each sharing a
common loop including a phase inverter and operating at
three broadband frequencies of 25 MHz to 55 MHz, 61.1
MHz to 128.3 MHz and 250.3 MHz to 317.5 MHz. The size
is less than 360 millimeter (mm) by 200 mm. The T/R switch
of the "[1]H Transmit/Receive Switch for 3T and 7T Magnetic
Resonance Imaging" cross-referenced paper includes a cou-
pler which does not share a common loop, has parallel
resonant circuits at the ports, operates in two different
frequency bands simultaneously (127.8 MHz and 298 MHz)
and is of size 110 mm by 105 mm for each coupler.

FIG. 1 is schematic diagram of a two-section branch-line
hybrid coupler 100. The 3T and 7T T/R switch of the present
technology has been designed based on the two-section
branch-line hybrid coupler 100. The coupler 100 is com-
posed of two sections of transmission lines, three vertical
lines (a, c, a) and four identical horizontal lines (b, b, b, b),
which have a common vertical connection through the phase
inverter as shown in FIG. 1. A quarter wavelength of the
resonance signal is the length that has been used for all
vertical and horizontal microstrip transmission lines. The
characteristic impedance of the transmission lines "a" 112
can be calculated based on the following formula:

$$Z_a = (\sqrt{k} + \sqrt{k+1})Z_o, \qquad (1)$$

where k is the ratio of the signal power appears at port 2 104
(through) to the signal power appears at port 4 (coupled) and
$Z_o$ is the port impedance (50Ω). If k=1, then the input signal
inserted at port 1 102 will be split equally at ports 2 104 and
4 108 with 90° phase shift due to the phase inverter 110 (−3
dB quadrature outputs), whereas port 3 106 is isolated. In
this case, a 90° hybrid coupler will by obtained. By substi-
tuting k=1 in equation (1), $Z_a$ becomes 2.414 $Z_o$. The
characteristic impedances of the transmission lines "b" 114
and "c" 116, were calculated based on the following for-
mula:

$$k = \frac{Z_o^2 Z_c^2}{Z_b^4}. \qquad (2)$$

Rearranging equation (2) results in:

$$Z_c = \frac{\sqrt{k}\, Z_b^2}{Z_o}. \qquad (3)$$

Figure 2A:
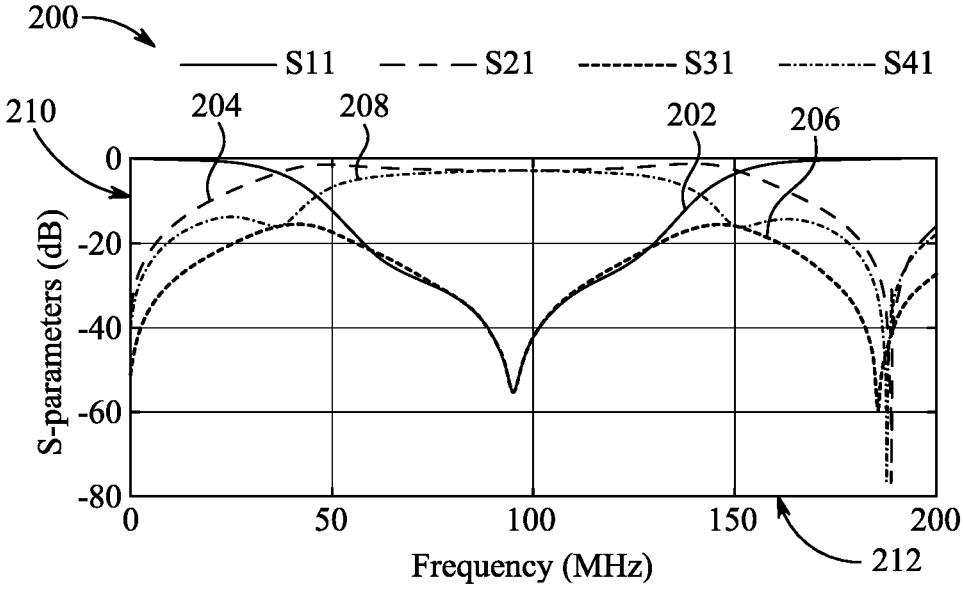
FIG. 2A depicts a simulation of S-parameters of the two-section branch-line hybrid coupler with k=1, according to certain embodiments.

FIG. 2A depicts simulated S-parameters plot 200 of the
two-section branch-line hybrid coupler 100 with k=1. The
S-parameters plot 200 is a graph of S-parameters along the
y-axis against frequency in MHz along the x-axis and
includes the S11 curve 202, the S21 curve 204, the S31 curve
206 and the S41 curve 208. If $Z_b=Z_o$, then Ze is equal to $Z_o$.
After calculating the characteristic impedances, the results
are $Z_a$=120.7Ω, $Z_b=Z_c$=50Ω.

Figure 2B:
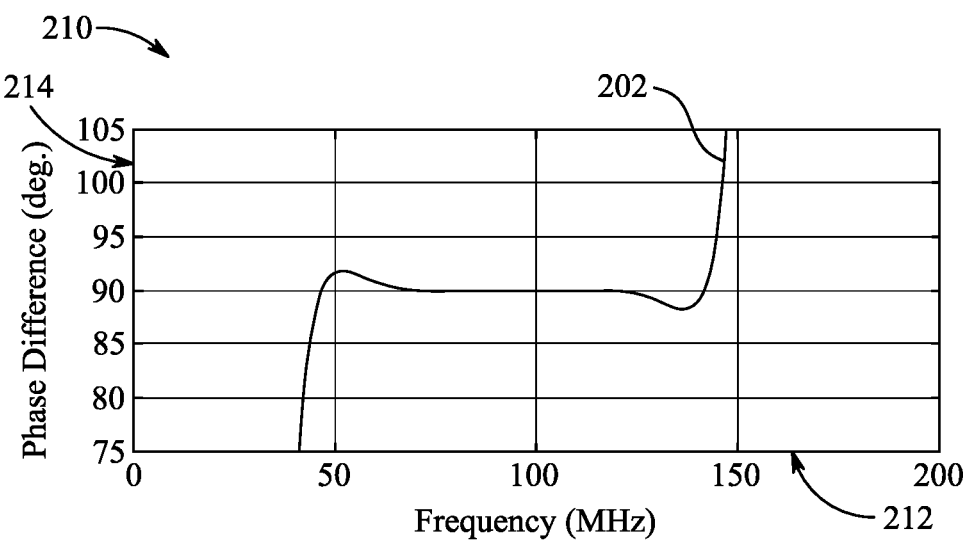
FIG. 2B depicts a phase difference between through ports and coupled ports, according to certain embodiments.

FIG. 2B depicts the phase difference between the coupled
ports of the two-section branch-line hybrid coupler 100. The
phase difference is a plot of the phase difference in degrees
along the y-axis versus the frequency in MHz along the
x-axis and includes the curve 202 showing the phase dif-
ference changes as frequency increases The working band-
width under a 1 dB magnitude imbalance and 5° phase
imbalance conditions was obtained from FIG. 2A and FIG.
2B and is about 48.2%.

In practice, a Rogers RO4003C substrate with relative
permittivity (&) 3.38 and thickness of 1.52 mm was used to
design the hybrid coupler (Rogers RO4003C is manufac-
tured by Rogers corporation, located at 2225 W. Chandler
Blvd., Chandler, Arizona 85224, United States of America).

Figure 3:
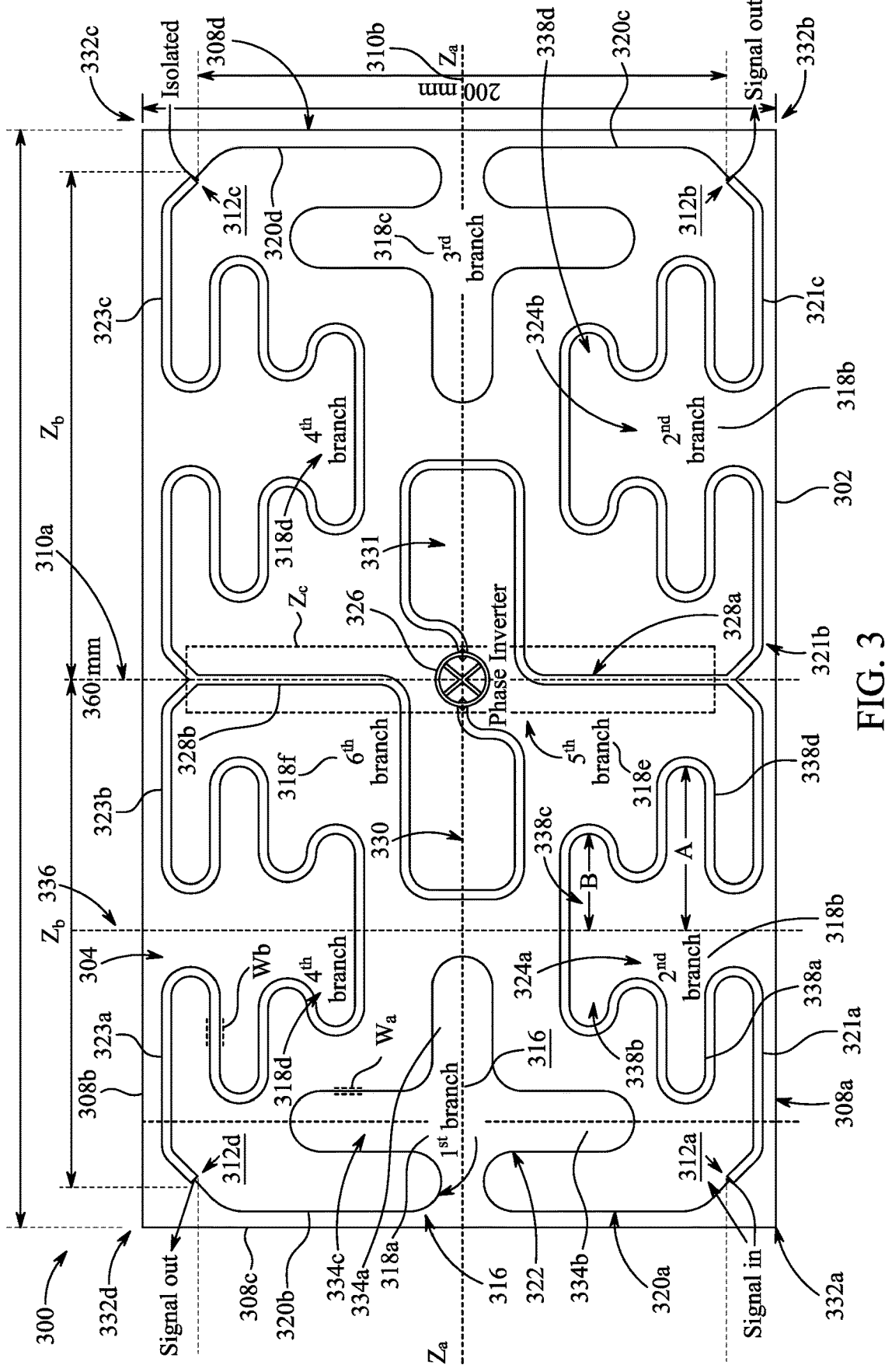
FIG. 3 depicts a layout of the two-section branch-line hybrid coupler, according to certain embodiments.

FIG. 3 depicts a circuit layout 300 of the two-section
branch-line hybrid coupler/broadband hybrid coupler 100
using the microstripline couplers of the present disclosure.
The broadband hybrid coupler 300 includes a dielectric
substrate 302 having a top side 304 and a bottom side (not shown in FIG. 3 but can be seen as the ground planes 414a and 414b shown in FIG. 14), a first edge 308a opposite to a second edge 308b, a third edge 308c opposite to a fourth edge 308d. A first central axis 310a of the dielectric substrate 302 is configured to bisect the first edge 308a and the second edge 308b and to extend from the first edge 308a to the second edge 308b. A second central axis 310b of the dielectric substrate is configured to bisect the third edge 308c and the fourth edge 308d and to extend from the third edge 308c to the fourth edge 308d. The broadband hybrid coupler 300 also includes a first port 312a, a second port 312b, a third port 312c, and a fourth port 312d. Each port is configured to connect to a sub-miniature radio frequency (RF) connector (not shown) inserted into the bottom side of the dielectric substrate 302. The broadband hybrid coupler 300 also includes a multi-bended microstripline 316 formed on the dielectric substrate 302. The multi-bended microstripline 316 has six branches, including a first branch 318a having a multi-bended structure extending between the first port 312a and the fourth port 312d and between the third edge 308c and the first central axis 310a. The multi-bended structure of the first branch 318a includes a first straight leg 320a connected to the first port 312a, a second straight leg 320b connected to the fourth port 312d and a three lobed loop 322 connected between the first straight leg 320a and the second straight leg 320b. The three lobed loop 322 is centered about the second central axis 310b. The multi-bended microstripline 316 also includes a second branch 318b extending between the first port 312a and the second port 312b, the second branch 318b comprising a first straight leg 321a connected to the first port 312a, a second straight leg 321b, a first four lobed loop 324a connected between the first straight leg 321a and the second straight leg 321b, a third straight leg 321c connected to the second port 312b, and a second four lobed loop 324b connected between the second straight leg 321b and the third straight leg 321c. The multi-bended microstripline 316 also includes a third branch 318c extending between the second port 312b and the third port 312c. The third branch 318c is a mirror image of the first branch 318a. The multi-bended microstripline 316 also includes a fourth branch 318d extending between the third port 312c and the fourth port 312d. The fourth branch 318d is a mirror image of the second branch 318b. The multi-bended microstripline 316 also includes a phase inverter 326 located at an intersection of the first central axis 310a and the second central axis 310b. The multi-bended microstripline 316 includes a fifth branch 318e located between an intersection of the second branch 318b with the first central axis 310a and the phase inverter 326, the fifth branch 318e comprising a straight leg 328a connected to the second leg 321b of the second branch 318b and a single lobed loop 331 connected to the phase inverter 326. The single lobed loop 331 extends from the first central axis 310a towards the fourth edge 308d, and is centered about the second central axis 310b. The multi-bended microstripline 316 also includes a sixth branch 318f located between an intersection of the second straight leg 323b of the fourth branch 318d with the first central axis 310a and the phase inverter 326, the sixth branch 318f comprising a straight leg 328b connected to the second leg 323b of the fourth branch 318d and a single lobed loop 330 connected to the phase inverter 326. The single lobed loop 330 extends from the first central axis 310a towards the third edge 308c, and the single lobed loop 330 is centered about the second central axis 310b. Each of the multi-bended structures of the first branch 318a and the third branch 318c have a microstripline width Wa. Each of the multi-bended structures of the second branch 318b, the fourth branch 318d, the fifth branch 318e and the sixth branch 318f have a microstripline width Wb, where the microstripline width Wb equals about seven times the microstripline width Wa. The multi-bended microstripline 316 is configured to receive RF electrical signals at the first port 312a and resonate the RF electrical signals at frequencies of about 95 MHz and about 285 MHz from the second port 312b and at the fourth port 312d. The frequencies at the fourth port 312d are orthogonal to the frequencies at the second port 312b, and the third port 312c is isolated.

The first port 312a is located at a first corner 332a of the dielectric substrate 302 between the first straight leg 320a of the first branch 318a and the first straight leg 321a of the second branch 318b. The first corner 332a is located between the first edge 308a and the third edge 308c. The second port 312b is located at a second corner 332b of the dielectric substrate 302 between the third straight leg 321c of the second branch 318b and a first straight leg 320c of the third branch 318c. The second corner 332b of is located between the first edge 308a and the fourth edge 308d. The third port 312c is located at a third corner 332c of the dielectric substrate 302 between a second straight leg 320d of the third branch 318c and a third straight leg 323c of the fourth branch 318d. The third corner 332c is located between the fourth edge 308d and the second edge 308b. The fourth port 312d is located at a fourth corner 332d of the dielectric substrate 302 between a first straight leg 323a of the fourth branch 318d and the second straight leg 320b of the first branch 318a. The fourth corner 332d is located between the third edge 308c and the second edge 308b.

The three lobed loop 322 of the first branch 318a includes a first lobe 334a which extends towards the first central axis 310a, a second lobe 334b which extends towards the first edge 308a and a third lobe 334c which extends towards the second edge 308b. The second lobe 334b and the third lobe 334c are mirror images of each other and each lobe of the three lobed loop 322 of the first branch 318a has a same width and a same length as each other lobe of the three lobed loop 322. The first lobe 334a is centered about the $2^{nd}$ central axis 310b.

The first four lobed loop 324a of the second branch 318b is centered about a branch axis 336 which extends from the first edge 308a to the second edge 308b and which is located halfway between the fourth port 312d and the first central axis 310a. A first lobe 338a and a fourth lobe 338d of the first four lobed loop 324a each have identical widths defined by a distance A from the branch axis 336 to the first central axis 310a. A second lobe 338b and a third lobe 338c of the first four lobed loop 324a each have identical widths defined by a distance B from the branch axis 336 towards the first central axis 310a, where the distance A is about two times the distance B. The third lobe 338c and a fourth lobe 338d of the first four lobed loop 324a of the second branch 318b are mirror images of the first lobe 338a and the second lobe 338b about the branch axis 336. The second four lobed loop 324b of the second branch 318b is a mirror image of the first four lobed loop 324a of the second branch 318b about the first central axis 310a.

The third branch 318c is a mirror image of the first branch 318a about the first central axis 310a and the fourth branch 318d is a mirror image of the second branch 318b about the second central axis 310b.

Figure 4:
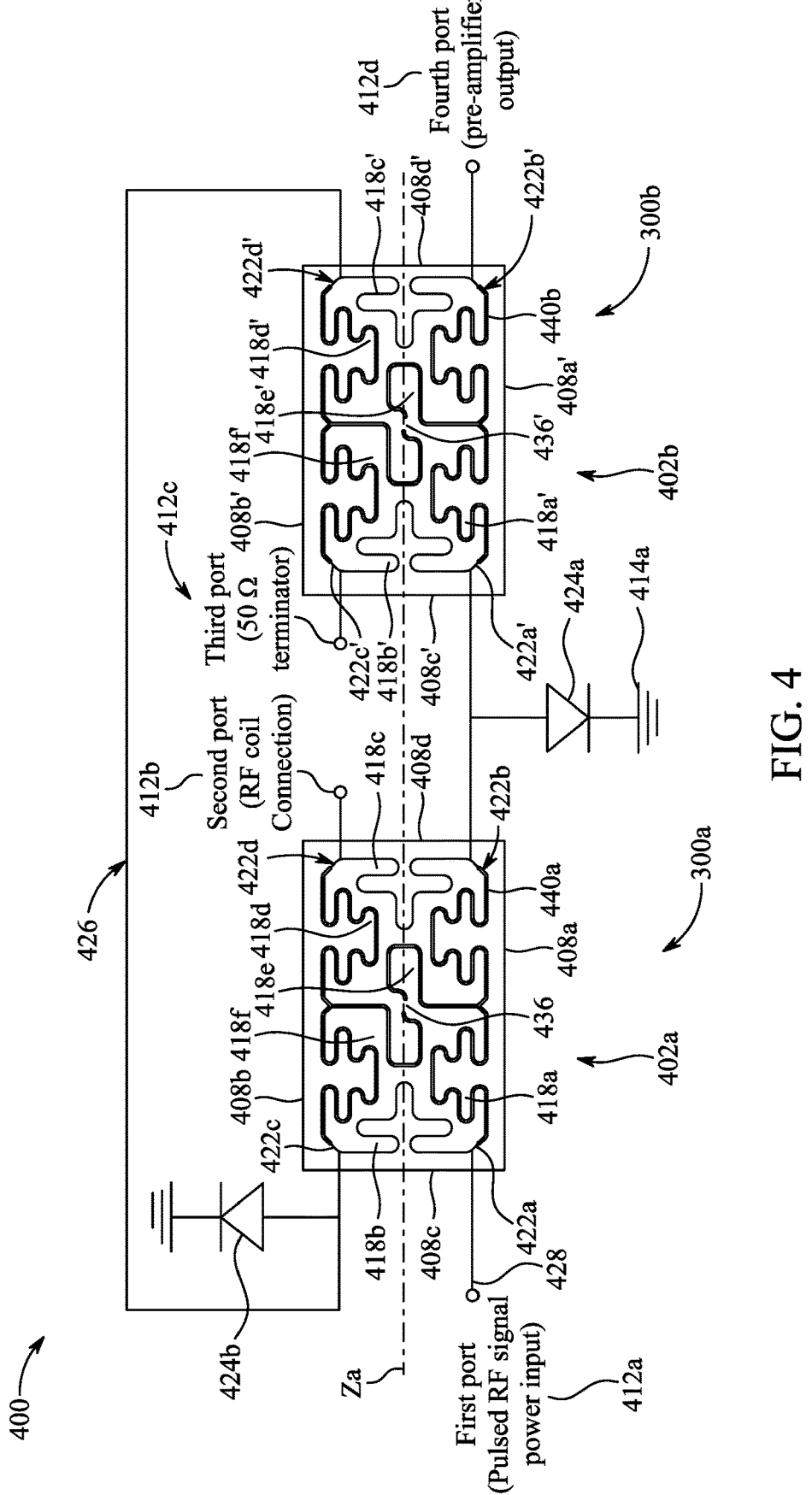
FIG. 4 depicts a two-section branch-line hybrid coupler based broadband transmit/receive switch, according to certain embodiments.
Figure 14:
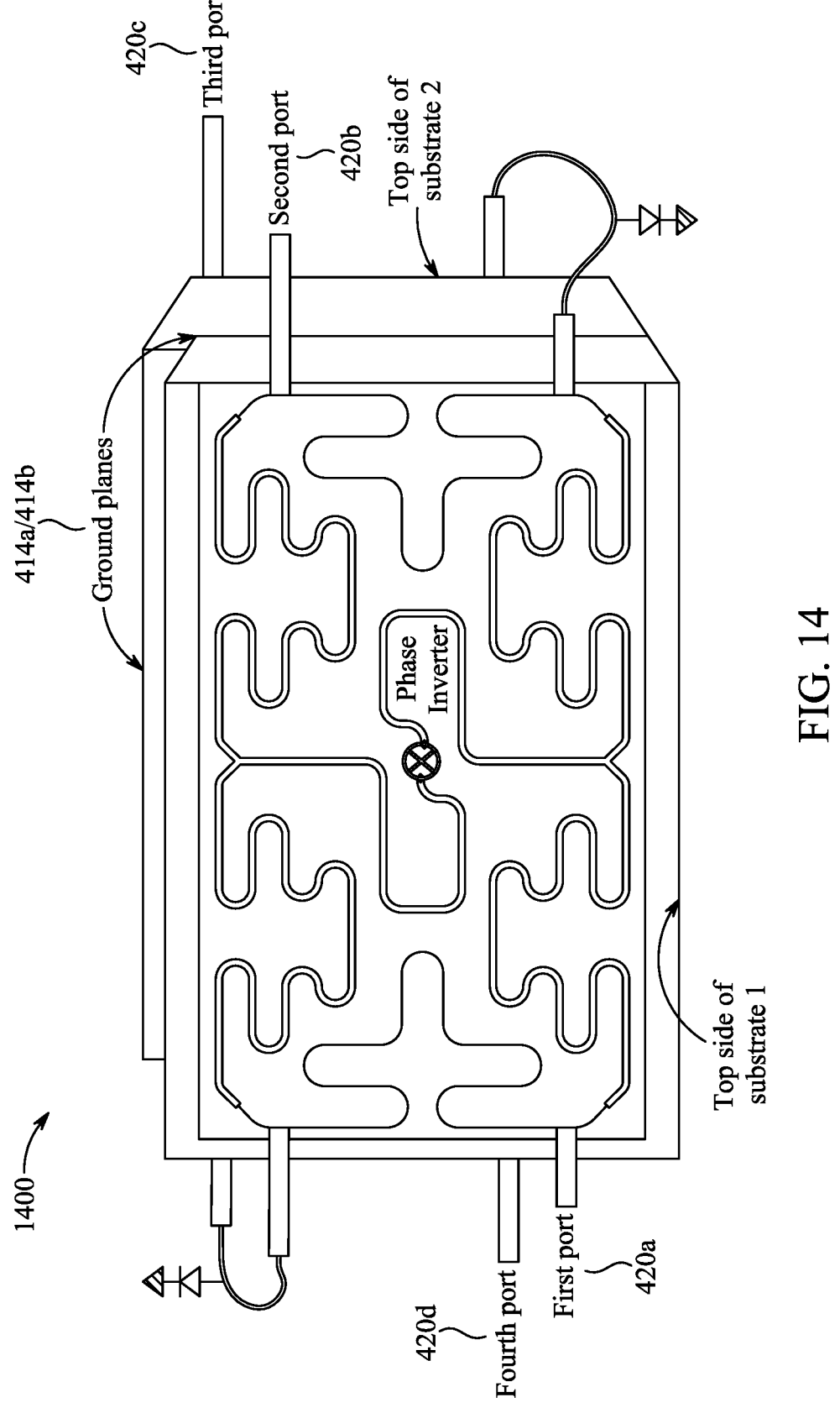
FIG. 14 depicts a front perspective view of the back to back T/R switch.

FIG. 4 depicts a two section (302a and 302b) hybrid microstripline transmit/receive switch 400 consisting of two branch-line hybrid couplers (300a, 300b), shown expanded out for the purpose of explanation. The two branch-line couplers (300a, 300b) are placed back to back, as shown in FIG. 14, to form the hybrid microstripline transmit/receive switch, The hybrid microstripline transmit/receive switch 400 is used in magnetic resonance imaging (MRI) of X-atomic nuclei at 3T and 7T magnetic field strengths. The hybrid microstripline transmit/receive switch 400 includes a first dielectric substrate 402*a* and a second dielectric substrate 402*b*. The configuration of the microstriplines of the branch line couplers (300*a*, 300*b*) on the first dielectric substrate 402*a* and a second dielectric substrate 402*b* is substantially similar to the broadband hybrid coupler 300 of FIG. 3. A first central axis 310*a* (as shown in the coupler of FIG. 3) of each dielectric substrate 402*a*, 402*b* is configured to bisect the first edge 408*a* and the second edge 408*b* and to extend from the first edge 408*a* to the second edge 408*b* and a second central axis 310*b* (as shown in the coupler of FIG. 3) of the dielectric substrate 402*a*, 402*b* is configured to bisect the third edge 408*c* and the fourth edge 408*d* and to extend from the third edge 408*c* to the fourth edge 408*d*. Equivalently, a first edge 408*a'*, a second edge 408*b'*, a third edge 408*c'* and a fourth edge 408*d'* of the dielectric circuit board 402*b* correspond to the edges of the second dielectric substrate 402*b*. The hybrid microstripline transmit/receive switch 400 includes the first broadband hybrid magnetic coupler 300*a* formed on the top side of the first dielectric substrate 402*a*. The first broadband hybrid magnetic coupler 300*a* includes a first multi-bended microstripline. The hybrid microstripline transmit/receive switch 400 also includes a first ground plane 414*a* formed on the bottom side of the first dielectric substrate 402*a* (see FIG. 14 for three dimensional illustration showing the position of the ground planes 414*a* and 414*b*). The hybrid microstripline transmit/ receive switch 400 also includes a second broadband hybrid magnetic coupler 300*b* formed on the top side of the second dielectric substrate 402*b*. The second broadband hybrid magnetic coupler 300*b* includes a second multi-bended microstripline. The second multi-bended microstripline is identical in configuration to the first multi-bended microstripline. The hybrid microstripline transmit/receive switch 400 also includes a second ground plane 414*b* formed on the bottom side of the second dielectric substrate 402*b* (see also FIG. 14). In FIG. 14, the second broadband hybrid magnetic coupler 300*b* is rotated so that the ground plane 414*b* attaches to the first ground plane 414*a* (See assembled hybrid microstripline transmit/receive switch 400 shown in FIG. 14). Each multi-bended microstripline includes a first branch (418*a*, 418*a'*), a second branch (418*b*, 418*b'*), a third branch (418*c*, 418*c'*), a fourth branch (418*d*, 418*d'*), a fifth branch (418*e*, 418*e'*) and a sixth branch (418*f*, 418*f'*). The fourth branch is a mirror image of the first branch about the second central axis, the third branch is a mirror image of the second branch about the first central axis, and the sixth branch is a mirror image of the fifth branch 418*e* about the second central axis. A phase inverter 326 (see FIG. 3) is connected at position (436, 436') is connected between the fifth branch and the sixth branch of each multi-bended microstripline. In an implementation, the phase inverter 418 is a 50Ω coaxial cable.

The hybrid microstripline transmit/receive switch 400 also includes a first port 412*a*, a second port 412*b*, a third port 412*c* and a fourth port 412*d*. The hybrid microstripline transmit/receive switch 400 also includes a first terminal 422*a* of the first branch 418*a* of the first multi-bended microstripline connected to the first port 420*a*. The hybrid microstripline transmit/receive switch 400 also includes a second terminal 422*b* of the first branch 418*a* of the first multi-bended microstripline 440*a* connected to a first terminal 422*a'* of a first branch 418*a'* of the second multi-bended microstripline 440*b*. The hybrid microstripline transmit/receive switch 400 also includes a first pin diode 424*a* connected between the second terminal 422*b* of the first branch 418*a* of the first multi-bended microstripline 440*a* and the first ground plane 414*a*. The hybrid microstripline transmit/receive switch 400 also includes a second terminal 422*b'* of the first branch of the second multi-bended microstripline connected to the fourth port 412*d*.

The hybrid microstripline transmit/receive switch 400 also includes a second terminal of the second branch 418*b* of the first multi-bended microstripline connected to a first terminal of the fourth branch 422*c* of the first multi-bended microstripline. The hybrid microstripline transmit/receive switch 400 also includes a connector 426 configured to connect the first terminal 422*c* of the fourth branch of the first multi-bended microstripline 440*a* with the second terminal of the fourth branch 422*d'* of the second multi-bended microstripline.

The hybrid microstripline transmit/receive switch 400 also includes a second pin diode 424*b* connected between the first terminal of the fourth branch 422*c* of the first multi-bended microstripline and the first ground plane 414*a*. The hybrid microstripline transmit/receive switch 400 also includes a first terminal of the third branch 418*c* of the first multi-bended microstripline 440*a* connected to a second terminal of the fourth branch 422*d* of the first multi-bended microstripline. The hybrid microstripline transmit/receive switch 400 also includes the second port 412*b* connected to the second terminal of the fourth branch 422*d* of the first multi-bended microstripline 440*a*. The hybrid microstripline transmit/receive switch 400 also includes a first terminal of the third branch 418*c'* of the second multi-bended microstripline 440*b* is connected to the second terminal of the fourth branch 422*d'* of the second multi-bended microstripline. The hybrid microstripline transmit/receive switch 400 also includes a first terminal of the second branch 418*b'* of the second multi-bended microstripline 440*b* connected to the first terminal of the first branch 418*a'* of the second multi-bended microstripline 440*b*. The hybrid microstripline transmit/receive switch 400 also includes a second terminal of the second branch 418*b'* of the second multi-bended microstripline 440*b* connected to a first terminal of the fourth branch 422*d'* of the second multi-bended microstripline 440*b*. The hybrid microstripline transmit/ receive switch 400 also includes the third port 412*c* connected to the first terminal 422*c'* of the fourth branch 422*d'* of the second multi-bended microstripline 440*b*. The hybrid microstripline transmit/receive switch 400 also includes a 50Ω terminator connected to the third port 412*c'*. The first port 412*a* is configured to receive a pulsed radio frequency (RF) signal power input 428 and transmit signals to the second port 412*b* when the first pin diode 424*a* and the second pin diode 424*b* are forward biased and to receive signals at the fourth port 412*d* at the 3T and 7T magnetic field strengths due to the resonance of the target nucleus when the first pin diode 424*a* and the second pin diode 424*b* are reversed biased. The hybrid microstripline transmit/ receive switch 400 is configured to operate in a first broadband frequency range of about 25 MHz to about 55 MH, in a second broadband frequency range of about 61 MHz to about 128 MHz, and in a third broadband frequency range of about 250 MHz to about 317 MHz.

In an implementation, the hybrid microstripline transmit/ receive switch 400 also includes a sub-miniature radio frequency (RF) connector located in each of the four corners of the dielectric substrates 402*a* and 402*b* and connecting to the ground plane. Each of the ports 412a to 412d is connected to a respective sub-miniature radio frequency (RF) connector.

The second branch 418b/418b' and the third branch 418c/418c' of each multi-bended microstripline each have a width Wa and the first branch 418a, the fourth branch 422d', the fifth branch 418e and the sixth branch 418f of each multi-bended microstriplines have a width Wb, where the width Wb equals about seven times the width Wa.

A first terminal of the fifth branch (418e, 418e') of each multi-bended microstripline is connected to an intersection of the first branch (418a, 418a') with the first central axis 310a (as shown in FIG. 3). A first terminal of the sixth branch (418f, 418f) of each multi-bended microstripline 440a and multi-bended microstripline 440b respectively is connected to an intersection of the fourth branch 418d with the first central axis 310a. A second terminal of the fifth branch (418e, 418e') of each multi-bended microstripline is connected to a first terminal of the phase inverter (436, 436'). The second terminal of the sixth branch (418f, 418f) of each multi-bended microstripline is connected to a second terminal of the phase inverter.

Figure 5:
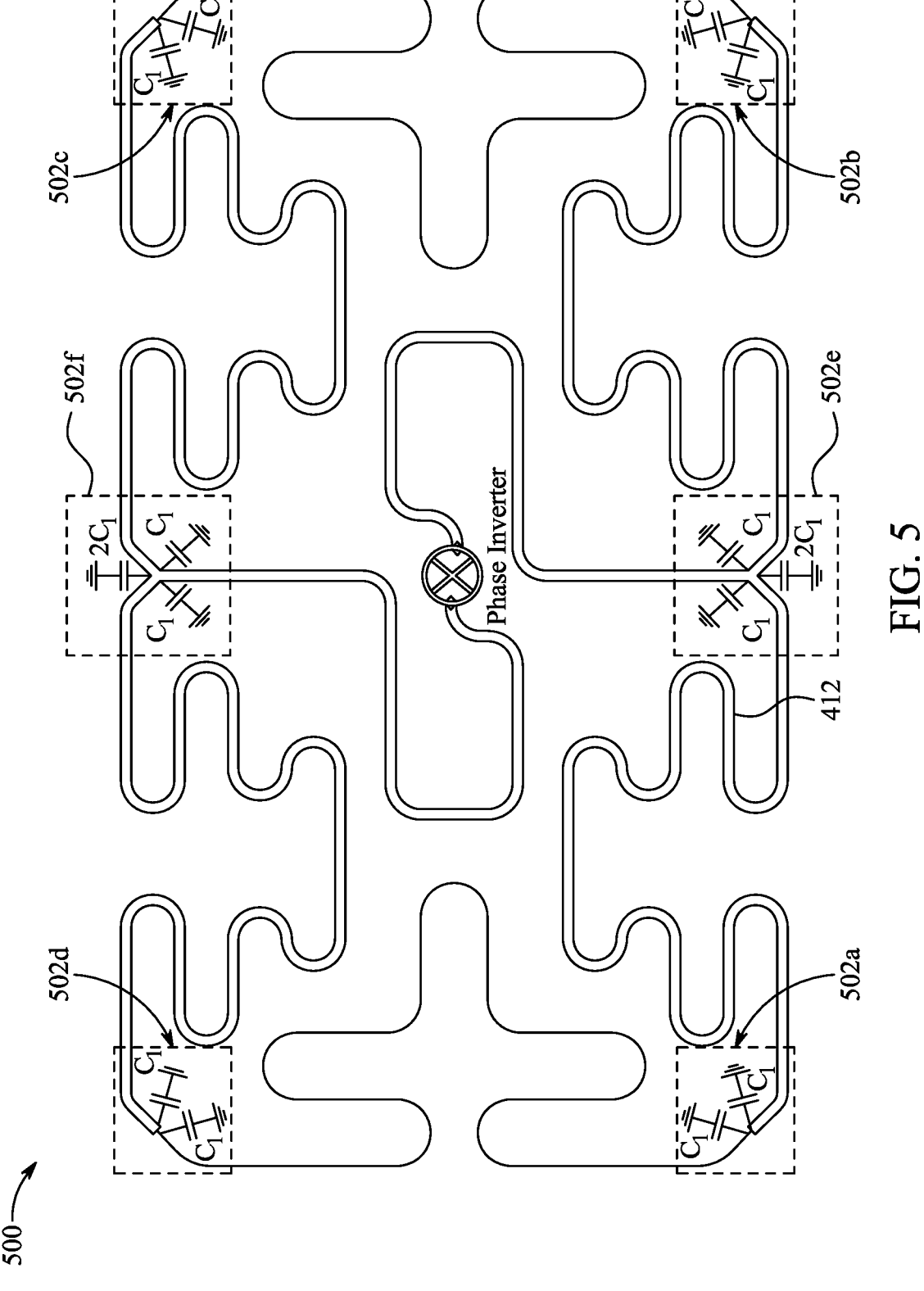
FIG. 5 depicts a layout of the two-section branch-line hybrid coupler with tuning capacitors, according to certain embodiments.

As shown in FIG. 5, the hybrid microstripline transmit/receive switch also includes a plurality of tuning capacitors attached to the ports at the terminal ends of each branch of each multi-bended microstripline. A capacitance value of each capacitor is configured to be tuned to adjust the fundamental frequency to match a magnetic resonance frequency of the target atom.

A pair of capacitors of the plurality of tuning capacitors is connected to each respective port of each branch of each multi-bended microstripline. More explicitly, a pair of capacitors is connected to the first port, the second port the third port and the fourth port. In a non-limiting example, each capacitor of the pair of capacitors has a capacitance value configured to be tuned in a capacitance range of zero to about 62 pF.

Further, a first capacitor of the plurality of tuning capacitors is connected to the first terminal of the fifth branch of each multi-bended microstripline, a second capacitor of the plurality of tuning capacitors is connected to the first terminal of the fifth branch of each multi-bended microstripline and a third capacitor of the plurality of tuning capacitors is connected to the intersection of the first terminal of the fifth branch with the first branch at the first central axis. The third capacitor has a capacitance value of twice the capacitance value of either of the first capacitor and the second capacitor. In a non-limiting example, the first capacitor and the second capacitor have capacitance values configured to be tuned in a capacitance range of zero to about 62 pF and the third capacitor has a capacitance value configured to be tuned in a capacitance range of zero to about 124 pF.

Similarly, a fourth capacitor of the plurality of tuning capacitors is connected to the first terminal of the sixth branch of each multi-bended microstripline, a fifth capacitor of the plurality of tuning capacitors is connected to the first terminal of the sixth branch of each multi-bended microstripline and a sixth capacitor of the plurality of tuning capacitors is connected to the intersection of the first terminal of the sixth branch with the first branch at the first central axis. The sixth capacitor has a capacitance value of twice the capacitance value of either of the first capacitor and the second capacitor. In a non-limiting example, the fourth capacitor and the fifth capacitor have capacitance values configured to be tuned in a capacitance range of zero to about 62 pF and the sixth capacitor has a capacitance value configured to be tuned in a capacitance range of zero to about 124 pF.

FIG. 5 is a circuit of the branch-line hybrid coupler 500 with the tuning capacitors showing the capacitors connected to a single broadband coupler representative of each of the two branch-line hybrid couplers of the hybrid microstripline transmit/receive switch 400 of FIG. 4. In an implementation, the hybrid microstripline transmit/receive switch 500 includes a plurality of tuning capacitors 502a-502f attached to each multi-bended microstripline. A capacitance value of each of the plurality of tuning capacitors 502a-502f is configured to be tuned to adjust a fundamental frequency to match a magnetic resonance frequency of a target atom. In an implementation, each of the plurality of tuning capacitors 502a-502f is connected to a respective terminal end of each branch of the multi-bended microstripline. Each capacitor 502a-502f has a capacitance value configured to be tuned in a capacitance range of one of: zero to 62 pico farad (pF) and zero to 124 pF.

In an implementation, a first pair of capacitors 502a of the plurality of tuning capacitors is connected to the junction between the first branch and the third branch, a second pair of capacitors 502b of the plurality of tuning capacitors is connected to the junction between the first branch and the third branch. A third pair of capacitors 502c of the plurality of tuning capacitors is connected to the junction between the third branch and the fourth branch and a fourth pair of capacitors 502d of the plurality of tuning capacitors is connected to a junction between the fourth branch and the first branch. Additionally, a pair of capacitors plus an additional capacitor, collectively designated by reference number 502e, are connected to the first terminal of the fifth branch. Similarly, a pair of capacitors plus an additional capacitor, collectively designated by reference number 502f, are connected to the first terminal of the sixth branch. The pair of capacitors of each of the fifth and sixth branch have capacitance values configured to be tuned in a capacitance range of zero to 62 pF and the additional capacitor has a capacitance value configured to be tuned in a capacitance range of zero to 124 pF.

In an implementation, the capacitance value of each capacitor 502a-502f is zero at a 3T magnetic field strength for the X-atomic nuclei which include $^1$H and $^{19}$F atoms for both a transmission and a reception mode. The capacitance value of each capacitor 502a-502f at a 3T magnetic field strength is configured to be tuned to adjust the fundamental frequency to match a respective magnetic resonance frequency of the X-atomic nuclei which include $^{31}$P, $^{23}$Na and $^{13}$C atoms in both the transmission and the reception modes. The capacitance value of each capacitor 502a-502f is zero at a 7T magnetic field strength for the X-atomic nuclei which include $^1$H, $^{19}$F and $^{31}$P atoms for both the transmission and the reception modes. The capacitance value of each capacitor 502a-502f at a 7T magnetic field strength is configured to be tuned to adjust the fundamental frequency to match a respective magnetic resonance frequency of the X-atomic nuclei which include $^{23}$Na and $^{13}$C atoms in both the transmission and the reception modes.

Figure 6:
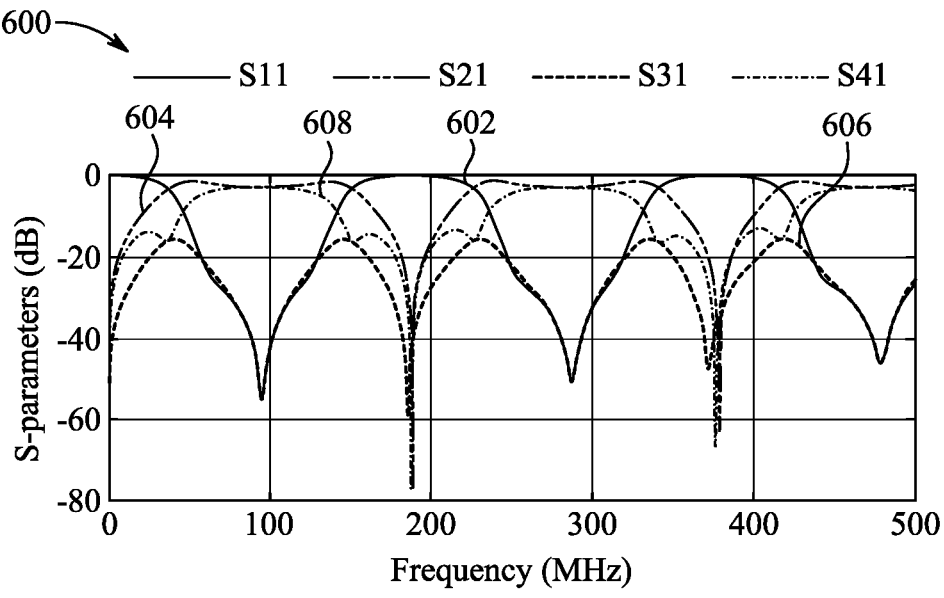
FIG. 6 depicts S-parameters for the two-section branch-line hybrid couplers, according to certain embodiments.

FIG. 6 depicts S-parameters 600 for the branch-line hybrid couplers. The EM-simulation S-parameters 600 are indicative for the two-section branch-line coupler 300. The S-parameters 600 is a plot of S-parameters along the y-axis versus frequency in megahertz along x-axis and includes a curve 602 representing the S11 parameter, a curve 604 representing the S21 parameter, a curve 606 representing the S31 parameter and a curve 608 representing the S41 parameter. It is characterized by two broadbands: a first broadband extending around the fundamental frequency (95 MHz), and a second broadband which extends around the third odd harmonics (285 MHZ). The bandwidths of the first broadband and the second broadband are configured in the ranges 70-120 MHz and 260-308 MHZ, respectively. The bandwidths have been calculated under following specifications: less than 1-dB magnitude imbalance and less than 5 phase imbalances. The two-section branch-line hybrid coupler demonstrates low return loss (S11 602<–25 dB) and high isolation (S31 606<–25 dB).

Figure 7:
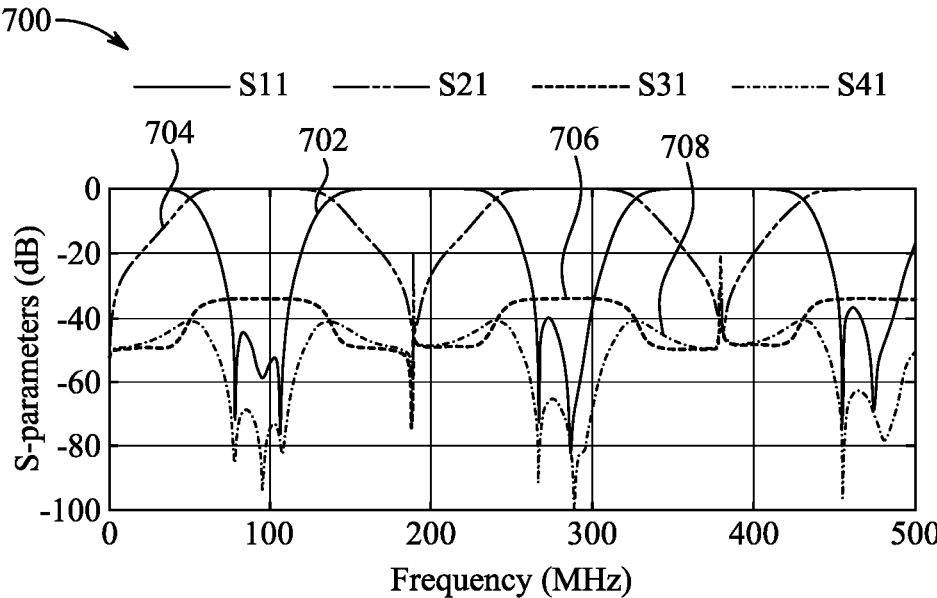
FIG. 7 depicts S-parameters at transmission state for two-section hybrid couplers based T/R switch, according to certain embodiments.

FIG. 7 depicts the S-parameters 700 at transmission state for the two section hybrid microstripline transmit/receive switch 400. The performance of the hybrid microstripline transmit/receive switch 400 can be evaluated from the obtained S-parameters 700 from the EM simulation. The S-parameters 700 is a plot of S-parameters along the y-axis versus frequency in megahertz along the x-axis and includes a curve 702 representative of the S11 parameter, a curve 704 representative of the S21 parameter, a curve 706 representative of the S31 parameters and a curve 708 representative of the S41 parameters. In the transmission state, the T/R switch demonstrates good matching (S11 702<–10 dB) and low insertion loss (S21 704>–0.56 dB) at all X-nuclei frequencies. In FIG. 7, the two broadbands of the T/R switch can be observed. The first band extends from about 61.1 MHz to about 128.3 MHz. The second band extends from about 250.3 MHz to about 317.5 MHz. The broadbands have been calculated under the following specifications: less than 1 dB insertion loss and less than 10 dB return loss. S31 706 and S41 708 are also calculated parameter values.

Figure 8:
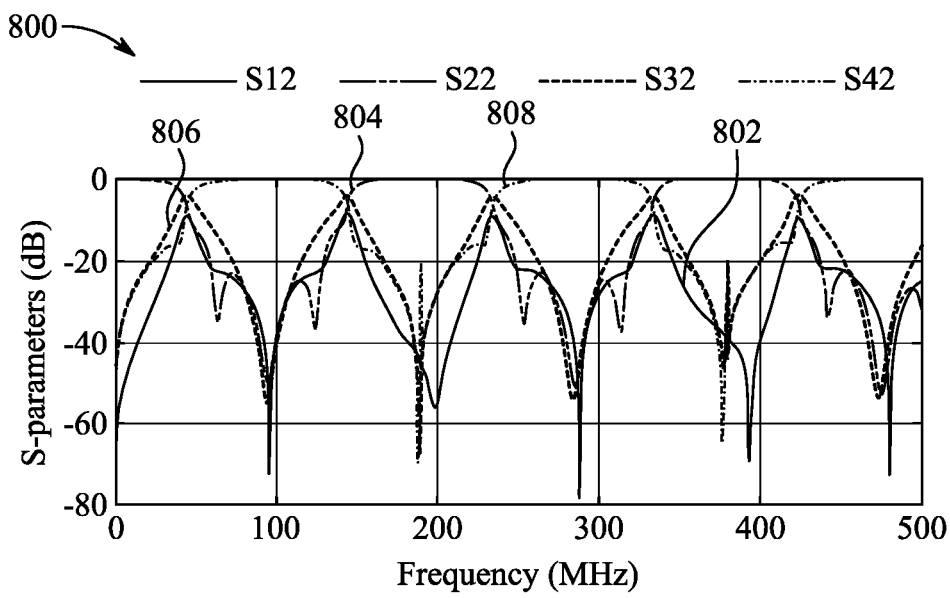
FIG. 8 depicts S-parameters at reception state for two-section hybrid couplers based T/R switch, according to certain embodiments.

FIG. 8 depicts S-parameters 800 at reception state for the two section hybrid microstripline transmit/receive switch 400. The S-parameters 800 is a plot of S-parameters along y-axis versus frequency in megahertz along the x-axis and includes a curve 802 representative of the S12 parameter, a curve 804 representative of the S22 parameter, a curve 806 representative of the S32 parameter, and a curve 808 representative of the S42 parameter. In addition, high isolation (S41 708<–44 dB) between port 1 (signal generator) and port 4 (the receiver) has been obtained. In the reception state, the T/R switch 400 demonstrates good matching (S22 804<–23.9 dB) and low insertion loss (S42 808<–0.32 dB) at all X-nuclei frequencies. From FIG. 8 the two broadbands of the T/R switch 400 can be observed as well. The insertion loss for both bands is less than 0.36 dB, and the return loss is less than 23.5 dB.

Figure 9:
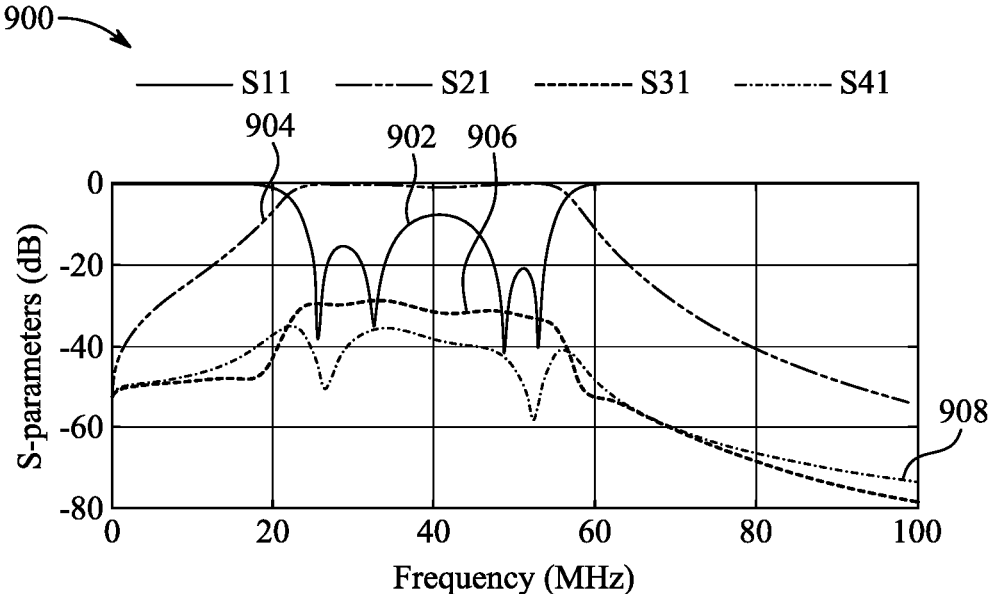
FIG. 9 depicts S-parameters at transmission state for two-section hybrid couplers based T/R switch after tuning, according to certain embodiments.

FIG. 9 depicts S-parameters 900 at transmission state for the two section hybrid microstripline transmit/receive switch 400 after tuning. The S-parameters 900 is a plot of S-parameters along the y-axis versus frequency in megahertz along the x-axis and includes a curve 902 representative of the S11 parameter, a curve 904 representative of the S21 parameter, a curve 906 representative of the S31 parameter and a curve 908 representative of the S41 parameter. In order to cover the rest of the X-nuclei frequencies, the hybrid couplers in the T/R switch have been tuned using a tuning capacitor, generally represented as tuning capacitor Ct. In the transmission state, the T/R switch demonstrates good matching (S11 902<–21 dB) and low insertion loss (S21 904>–0.35 dB) at the remaining X-nuclei frequencies, as shown in FIG. 9.

Figure 10:
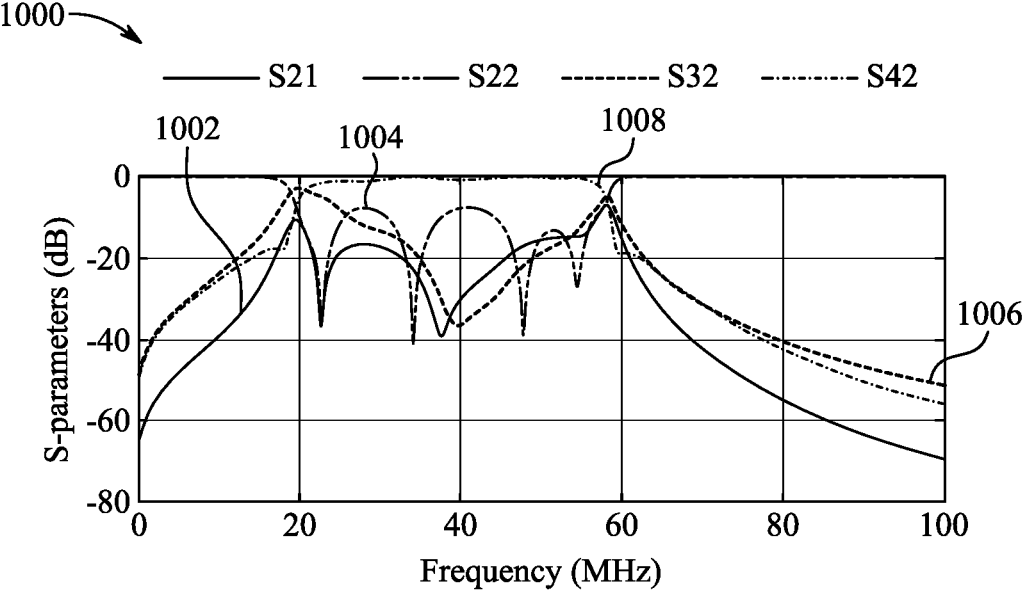
FIG. 10 depicts S-parameters at reception state for two-section hybrid couplers based T/R switch after tuning, according to certain embodiments.

FIG. 10 depicts S-parameters 1000 at reception state for the two section hybrid microstripline transmit/receive switch 400 after tuning. The S-parameters 1000 is a plot of S-parameters along the y-axis versus frequency in megahertz along the x-axis and includes a curve 1002 representatative of the S21 parameter, a curve 1004 representative of the S22 parameter, a curve 1006 representative of the S32 parameter and a curve 1008 representative of the S42 parameter. High isolation (S41 908<–35.9 dB) between port 1 (signal generator) and port 4 (the receiver) was obtained. At reception state, the T/R switch 400 demonstrates good matching (S22 1002<–11.1 dB) and low insertion loss (S42 1008<–0.6 dB) at the remaining X-nuclei frequencies, as shown in FIG. 10.

Figure 11:
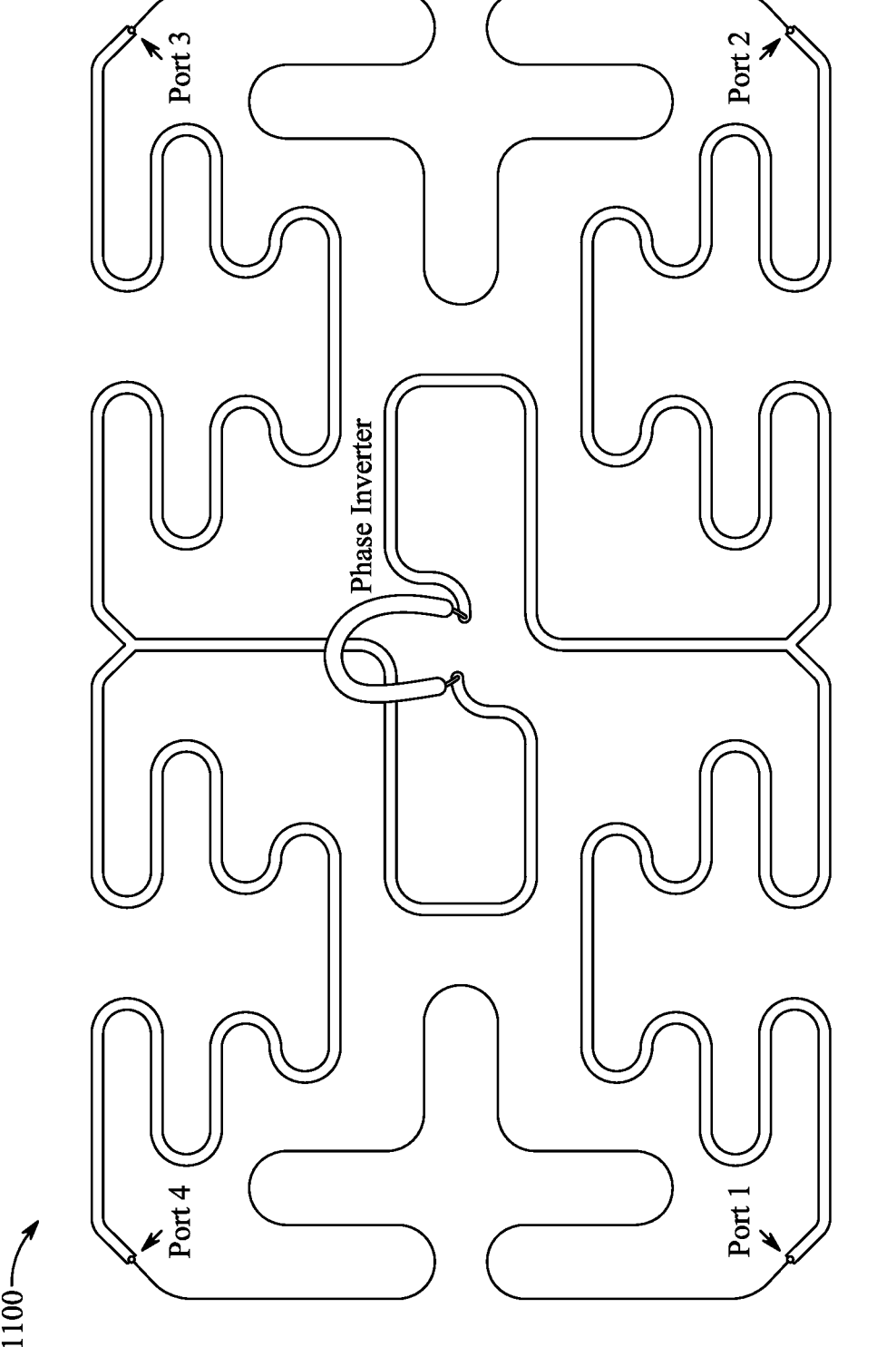
FIG. 11 depicts a prototype of the two-section branch-line hybrid coupler, according to certain embodiments.

FIG. 11 depicts a prototype 1100 of the two-section branch-line hybrid coupler 100. The prototype 1100 of the two-section branch-line hybrid coupler 100 is fabricated on a 360 mm×200 mm Rogers RO4003C substrate with relative permittivity ($\varepsilon_r$) 3.38 and thickness of 1.52 mm, as shown in FIG. 11. SMA connectors for each port were soldered from the bottom side of the substrate. The T/R switch 400 is easily fabricated by using two two-section branch-line hybrid couplers 100, shown in FIG. 11, that are connected back-to-back in such a way that the ground planes of the two substrates have been joined together. To obtain internal connections between both the couplers, corresponding to the connections shown in FIG. 4, two thin wires are inserted through the ground planes. Two PIN diodes are placed on the first coupler at ports 2 and 4 in the same position of the two thin wires.

Figure 12A:
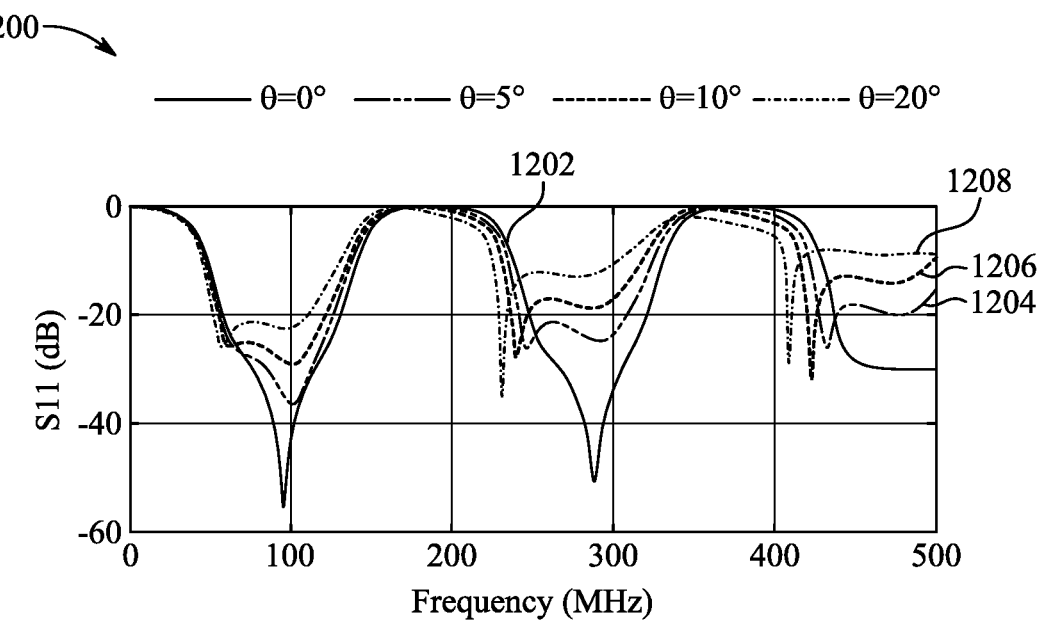
FIG. 12A depicts a simulated (θ=0°) S11 and S21 parameters for different coaxial cable lengths, according to certain embodiments.
Figure 12B:
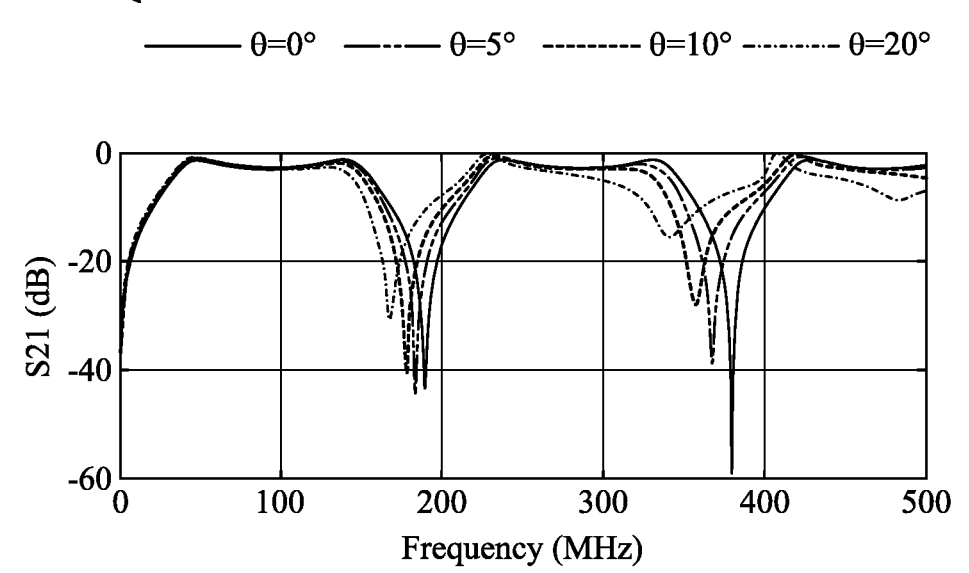
FIG. 12B depicts measured (θ=5°, 10° and 20°) S11 and S21 parameters for different coaxial cable lengths, according to certain embodiments.

FIG. 12A depicts simulated (θb=0°) and measured (θ=5°, 10° and 20°) S11 parameters for phase shifts due to different coaxial cable lengths of the phase inverters. FIG. 12B depicts simulated (θb=0°) and measured (θ=5°, 10° and 20°) S21 parameters for different coaxial cable lengths of the phase inverters. The simulated (θ=0°) and measured (θ=5°, 10° and 20°) S11 1200 for different coaxial cable lengths is a plot of S-11 along the y-axis versus the frequency in megahertz along the x-axis and includes a curve 1202 representative of the simulated θ=0° length, a curve 1204 representative of the measured θ=5° length, a curve 1206 representative of the measured θ=10° length and a curve 1208 representative of the measured θ=20° length. The simulated (θ=0°) and measured (θ=5°, 10° and 20°) S21 1210 for the phase changes due to the different coaxial cable lengths is a plot of of S-21 along the y-axis versus frequency in megahertz along x-axis. The phase inverter (180° phase shifter) in the middle of the coupler is implemented by using a short 50Ω coaxial cable on a crossover configuration. The effect of the electrical length of the coaxial cable (phase inverter) on the coupler characteristic is shown in FIG. 12B. The higher the electrical length added, the lower the phase shift (less than 180°. This deviation from the 180° phase shift leads to an increase in the return loss and reduction of the bandwidth on the third odd harmonics. From FIG. 12A it is noticeable that the acceptable deviation is 10° (θ=10°) 1206 to maintain the return loss less than 10 dB and the bandwidth at least 90% coinciding with that one without deviation from the 180° (θ=0°) 1202. In practical, the physical length of the connected coaxial cable corresponds to a 5° electrical length 1204. Note that, the electrical length was calculated based on the 95 MHz fundamental frequency of the coupler. The simulated (θ=0°) and measured (θ=5°, 10° and 20° 1208) S11 1200 and S21 1210 parameters for different coaxial cable length are shown.

Figure 13A:
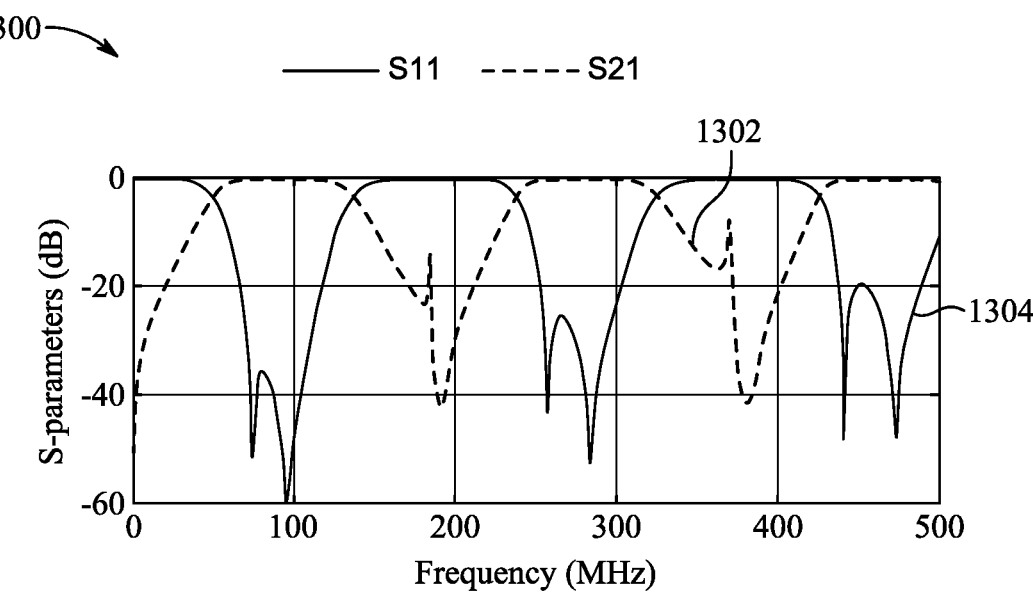
FIG. 13A depicts measured S-parameters for two-section hybrid couplers based T/R switch at the transmission state, according to certain embodiments.
Figure 13B:
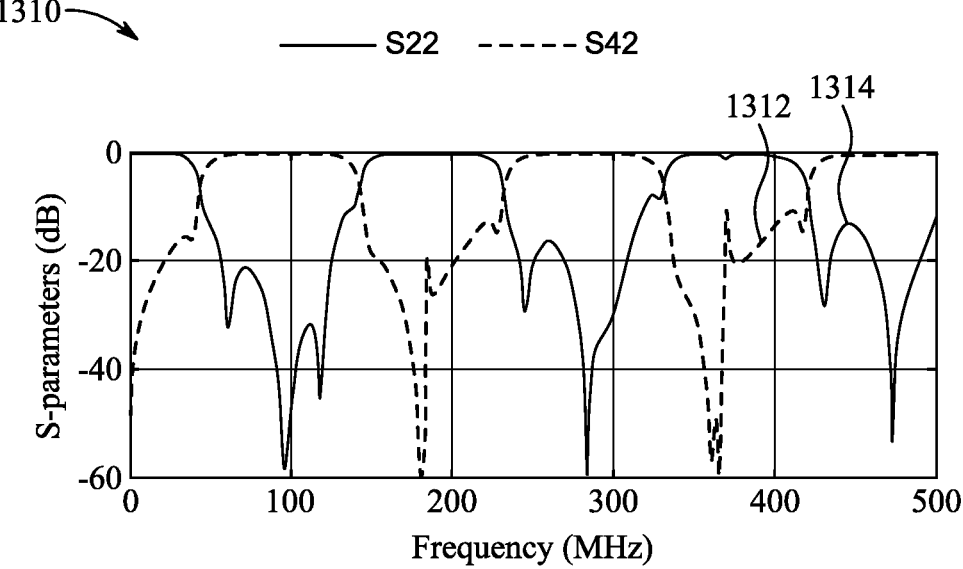
FIG. 13B depicts measured S-parameters for two-section hybrid couplers based T/R switch at the reception state, according to certain embodiments.

FIG. 13A and FIG. 13B depict measured S-parameters for the two section hybrid microstripline transmit/receive switch 400 at transmission state and reception state respectively. FIG. 13A and FIG. 13B show the measured S-parameters of the T/R switch 400 during transmission 1300 and reception states 1310a, respectively. FIG. 1A is a plot of S11 and S21 parameters along the y-axis versus frequency in megahertz versus the x-axis and includes the curves 1302 representing the S21 parameters and 1304 representing the S11 parameters. In the transmission state, the T/R switch 400 demonstrates good matching (S11 1304<−10 dB) and low insertion loss (S21 1302>−0.8 dB) at all X-nuclei frequencies. In the reception state, the T/R switch 400 demonstrates good matching (S22 1314<−17 dB) and low insertion loss (S42 1312>−0.4 dB) at all X-nuclei frequencies.

FIG. 14 depicts a front perspective view of a back to back T/R switch 1400. The back to back T/R switch 1400 includes first port 420a configured for receiving the input signal, a second port 420b connected to the RF coil which creates the magnetic field over the patient, a third port 420c connected to the 50 ohm terminator which provides isolation of Port 3 and a fourth port 420d which receives the magnetic field from the body. The ground planes 414a and 414b on the bottom side of each dielectric substrate are joined.

FIG. 15A-FIG. 15B depicts a flowchart 1500 of a method of using a hybrid microstripline transmit/receive switch for magnetic resonance imaging (MRI) of X-atomic nuclei at 3 tesla (T) and 7T magnetic field strengths. In FIG. 15A, at step 1502, in the transmission mode, the first pin diode and the second pin diode are forward biased. At step 1504, electrical signals generated by a power amplifier are applied to a first port of the hybrid microstripline transmit/receive switch. At step 1506, the magnetic field strength of the electrical signals is adjusted to one of a 3T magnetic field strength and a 7T magnetic field strength. At step 1508, a capacitance value of each of a plurality of capacitors connected to branches of multi-bended microstriplines which form multi-lobed transmission paths of the hybrid microstripline transmit/receive switch is tuned to sweep an operating frequency of the electrical signals over the resonance frequencies of a target X-nucleus. At step 1510, interference is minimized by connecting the 50Ω terminator to a third port. At step 1512, the electrical signals are transmitted at the tuned operating frequency to a radio frequency coil of a magnetic resonance imager from a second port to a target area of a patient.

In FIG. 15B, at step 1514, in a reception mode, the first pin diode and the second pin diode are reverse biased. At step 1516, electrical signals emitted from the target area are received at the fourth port. At step 1518, a resonance frequency of the received electrical signals is determined. At step 1520, a determination is made as to whether the resonance frequency of the received electrical signals matches the resonance frequency of one of the set of X-nuclei. The set of X-nuclei includes $^1$H, $^{19}$F, $^{31}$P, $^{23}$Na and $^{13}$C. At step 1522, the target area is scanned with the electrical signals at the resonance frequency of the matched X-nucleus to generate an image of the target area.

The present technology provides a broadband switch for 3T and 7T magnetic resonance imaging. The broadband 3T and 7T T/R switch has a capability to cover the frequencies corresponding to the common X-nuclei resonant frequencies at 3T and 7T MRI. The resonances which are above 61 MHz fall within two broadbands offered by the switch without the need of tuning. However, the lower frequencies can be covered after applying tuning to the capacitors.

The $^1$H-nuclear magnetic resonance spectroscopic imaging is a noninvasive imaging method that provides information about cellular activity (metabolic information). It is used along with magnetic resonance imaging (MRI) which provides information about the shape and size of the tumor (spatial information), also called as magnetic resonance spectroscopic imaging, MRSI, and proton magnetic resonance spectroscopic imaging. To reduce the overall size of the T/R switch, both couplers are placed back-to-back to bond the ground planes together. The coupled and through ports of the first coupler are connected to the corresponding ports in the second coupler internally through small connectors. The phase inverter (180° phase shifter) in the middle of each coupler can be implemented by using a coaxial cable on a crossover configuration.

Embodiments of the disclosure are illustrated with respect to FIG. 1 to FIG. 10B. In an embodiment, a broadband hybrid magnetic coupler for magnetic resonance imaging (MRI) of atomic nuclei is described. The broadband hybrid magnetic coupler includes a dielectric substrate having a top side 304 and a bottom side, a first edge 308a opposite to a second edge 308b, a third edge 308c opposite to a fourth edge 308d, wherein a first central axis 310a of the dielectric substrate 302 is configured to bisect the first edge 308a and the second edge 308b and to extend from the first edge 308a to the second edge 308b and wherein a second central axis 310b of the dielectric substrate 302 is configured to bisect the third edge 308c and the fourth edge 308d and to extend from the third edge 308c to the fourth edge 308d. The broadband hybrid magnetic coupler includes a first port 312a, a second port 312b, a third port 312c and a fourth port 312d. Each port is configured to connect to a sub-miniature radio frequency (RF) connector located on the bottom side of the dielectric substrate 302. A multi-bended microstripline 316 formed on the dielectric substrate 302. The multi-bended microstripline 316 has six branches including a first branch 318a having a multi-bended structure extending between first port 312a and the fourth port 312d and between the third edge 308c and the first central axis 310a. The multi-bended structure of the first branch includes a first straight leg 320a connected to the first port 312a, a second straight leg 320b connected to the fourth port 312d and a three lobed loop 322 connected between the first straight leg 320a and the second straight leg 320b. The three lobed loop 322 is centered about the second central axis 310b. A second branch 318b extends between the first port 312a and the second port 312b, the second branch 318b comprising a first straight leg 321a connected to the first port 312a, a second straight leg 321b, a first four lobed loop 324a connected between the first straight leg 321a and the second straight leg 321b, a third straight leg 321c connected to the second port 312b, and a second four lobed loop 324b connected between the second straight leg 321b and the third straight leg 321c. A third branch 318c extends between the second port 312b and the third port 312c. The third branch 318c is a mirror image of the first branch 318a. A fourth branch 318d extends between the third port 312c and the fourth port 312d. The fourth branch 318d is a mirror image of the second branch 318b. A phase inverter 180 is located at an intersection of the first central axis 310a and the second central axis 310b, a fifth branch 318e is located between an intersection of the second branch with the first central axis and the phase inverter, the fifth branch comprising a straight leg connected to the second branch and a single lobed loop 331 connected to the phase inverter 180. The single lobed loop 331 extends from the first central axis 310a towards the fourth edge 308d. The single lobed loop 331 is centered about the second central axis 310b. A sixth branch 318f is located between an intersection of the fourth branch 318d with the first central axis 310a and the phase inverter 180, the sixth branch 318f comprising a straight leg 328b connected to the fourth branch 318d and a single lobed loop 330 connected to the phase inverter 180. The single lobed loop 330 extends from the first central axis 310a towards the third edge 308c. The single lobed loop 330 is centered about the second central axis 310b. Each of the microstriplines 316 of the first branch 318a and the third branch 318c have a width Wa. Each of the microstriplines 316 of the second branch 318b, the fourth branch 318d, the fifth branch 318e and the sixth branch 318f have a width Wb, where the width Wb equals about seven times the width Wa, The multi-bended microstripline 316 is configured to receive electrical signals at the first port 312a and resonate the electrical signals at frequencies of about 95 MHz and about 285 MHz at the second port 312b and at the fourth port 312d. The frequencies at the fourth port 312d are orthogonal to the frequencies at the second port 312b, and the third port 312c is isolated.

In an aspect, the first port 312a is located at a first corner 332a of the dielectric substrate 302 between the first straight leg 320a of the first branch 318a and the first straight leg 321a of the second branch 318b. The first corner 332a is located between the first edge 308a and the third edge 308c. The second port 312b is located at a second corner 332b of the dielectric substrate between the third straight leg of the second branch and a first straight leg of the third branch. The second corner 332b is located between the first edge and the fourth edge. The third port is located at a third corner 332c of the dielectric substrate between a second straight leg 320d of the third branch and a second straight leg 323c of the fourth branch 318d. The third corner 332c is located between the fourth edge 308d and the second edge 308b. The fourth port 312d is located at a fourth corner 332d of the dielectric substrate 302 between a first straight leg 323a of the fourth branch 318d and the second straight leg 320b of the first branch 318a. The fourth corner 332d is located at the intersection of the third edge 308c and the second edge 308b.

In an aspect, the three lobed loop 322 of the first branch 318a includes a first lobe 334a which extends towards the first central axis 310a, a second lobe 334b which extends towards the first edge 308a and a third lobe 334c which extends towards the second edge 308b. The second lobe 334b and the third lobe 334c are mirror images, and each lobe of the three lobed loop 322 of the first branch 318a has a same width and a same length as each other lobe of the three lobed loop 322.

In an aspect, the first four lobed loop of the second branch 318b is centered about a branch axis 336 which extends from the first edge 308a to the second edge 308b and which is located halfway between the fourth port 312d and the first central axis 310a. A first lobe 338a of the first four lobed loop extends towards the third edge a distance A and a second lobe 334b of the first four lobe loop 324a extends towards the third edge 308c a distance B, where the distance A is about two times the distance B. Note that A and B are shown in FIG. 3 drawn in a third lobe 334c and a fourth lobe 338d of the first four lobed loop due to space constraints of the drawing.

In an aspect, a third lobe 334c and a fourth lobe 338d of the first four lobed loop 322 of the second branch 318b are mirror images of the first lobe 334a and the second lobe 334b about the branch axis 336, and the second four lobed loop 322 of the second branch is a mirror image of the first four lobed loop of the second branch about the first central axis.

In an aspect, the third branch is a mirror image of the first branch 318a about the first central axis 310a, and the fourth branch 318d is a mirror image of the second branch 318b about the second central axis 310b.

In another embodiment, a hybrid microstripline transmit/receive switch 400 for use in magnetic resonance imaging (MRI) of X-atomic nuclei at 3T and 7T magnetic field strengths is described. The hybrid microstripline transmit/receive switch 400 includes a first dielectric substrate 402a and a second dielectric substrate 402b, wherein each dielectric substrate includes a top side, a bottom side and four corners, a first edge 408a opposite to a second edge 408b, a third edge 408c opposite to a fourth edge 408d, wherein a first central axis (310a shown in FIG. 3) of each dielectric substrate (402a, 402b) is configured to bisect the first edge 408a and the second edge 408b and to extend from the first edge 408a to the second edge 408b and wherein a second central axis (310b shown in FIG. 3) of the dielectric substrate 402a is configured to bisect the third edge 408c and the fourth edge 408d and to extend from the third edge 408c to the fourth edge 408d, and a first broadband hybrid magnetic coupler 300a formed on the top side of the first dielectric substrate 402a. The first broadband hybrid magnetic coupler 300a includes a first multi-bended microstripline. The hybrid microstripline transmit/receive switch 400 includes a first ground plane 414a formed on the bottom side of the first dielectric substrate (shown in FIG. 14). A second broadband hybrid magnetic coupler 300b is formed on the top side of the second dielectric substrate 402b. The second broadband hybrid magnetic coupler 300b includes a second multi-bended microstripline. The second multi-bended microstripline is identical in configuration to the first multi-bended microstripline and similar features are designated with primed notation. The hybrid microstripline transmit/receive switch 400 includes a second ground plane 414b formed on the bottom side of the second dielectric substrate 402b (shown in FIG. 14). The second ground plane 414b is attached to the first ground plane 414a. Each multi-bended microstripline includes a first branch 418a, a second branch 418b, a third branch 418c, a fourth branch 418d, a fifth branch 418e and a sixth branch 418f wherein the identifying numerals of the second multi-bended microstripline are distinguished with primed notation, i.e. 418a', 418b', and the like. The fourth branch 418d is a mirror image of the first branch 418a about the second central axis, the third branch 418c is a mirror image of the second branch 418b about the first central axis 410a, and the sixth branch 418f is a mirror image of the fifth branch 418e about the second central axis. The hybrid microstripline transmit/receive switch 400 includes a phase inverter (not shown in FIG. 4, but identical to the phase inverter 326 of FIG. 3) at location 436 connected between the fifth branch 418e and the sixth branch 418f of each multi-bended microstripline. The hybrid microstripline transmit/receive switch 400 includes a first port 412a, a second port 412b, a third port 412c and a fourth port 412d, wherein a first terminal 422a of a first branch 418a of the first multi-bended microstripline is connected to the first port 412a, a second terminal 422b of the first branch 418a of the first multi-bended microstripline is connected to a first terminal 422a' of a first branch 418a' of the second multi-bended microstripline, a first pin diode 424a is connected between the second terminal 422b of the first branch 418a of the first multi-bended microstripline and the first ground plane 414a, a second terminal 422b' of the first branch 418a' of the second multi-bended microstripline is connected to the fourth port 412d, a first terminal of the second branch of the first multi-bended microstripline is connected to the first port, a second terminal of the first branch of the first multi-bended microstripline is connected to a first terminal of the fourth branch of the first multi-bended microstripline, wherein a microstripline connector is configured to connect the first terminal 422c of the fourth branch 418d of the first multi-bended microstripline with the second terminal 422b' of the fourth branch 418d' of the second multi-bended microstripline. A second pin diode 424b is connected between the first terminal 422c of the fourth branch 418d of the first multi-bended microstripline and the first ground plane 414a, a second terminal 422b of the third branch 418c of the first multi-bended microstripline is connected to a second terminal 422b of the first branch 418d of the first multi-bended microstripline, wherein the second port 412b is connected to the second terminal 422d of the fourth branch 418d of the first multi-bended microstripline, a first terminal 422a' of the first branch 418a' of the second multi-bended microstripline is connected to the second terminal 422b of the first branch 418d of the first multi-bended microstripline, a first terminal of the second branch 418b' of the second multi-bended microstripline is connected to the first terminal 422a' of the first branch 418a' of the second multi-bended microstripline, a second terminal of the second branch 418b' of the second multi-bended microstripline is connected to a first terminal 422c' of the fourth branch 418d' of the second multi-bended microstripline, the third port 412c' is connected to the first terminal 422c' of the fourth branch 418d' of the second multi-bended microstripline, and a 50Ω terminator connected to the third port 412c. The first port 412a is configured to receive a pulsed radio frequency (RF) signal power input 428 and transmit signals to the second port 412b when the first pin diode 424a and the second pin diode 424b are forward biased and to receive signals at the fourth port 412d at the 3T and 7T magnetic field strengths when the first pin diode 424a and the second pin diode 424b are reversed biased. The hybrid microstripline transmit/receive switch 400 is configured to operate in a first broadband frequency range of about 25 MHz to about 55 MH, in a second broadband frequency range of about 61 MHz to about 128 MHZ, and in a third broadband frequency range of about 250 MHz to about 317 MHz.

In an aspect, the hybrid microstripline transmit/receive includes a sub-miniature radio frequency (RF) connector located on each of the four corners of the dielectric substrate, wherein each port is connected to a respective sub-miniature radio frequency (RF) connector.

In an aspect, the first branch 318a and of the third branch 318c of each multi-bended microstripline 316 each have a width Wa, and the second branch 318b, the fourth branch 318d, the fifth branch 318e and the sixth branch 318f of each multi-bended microstripline 316 have a width Wb, where the width Wb equals about seven times the width Wa.

In an aspect, the hybrid microstripline transmit/receive switch 400 includes a first terminal of the fifth branch (418e, 418e') of each multi-bended microstripline connected to an intersection of the first branch (418a, 418a') with the first central axis, a first terminal of the sixth branch (418f, 418f') of each multi-bended microstripline respectively is connected to an intersection of the fourth branch (418d, 418d') with the first central axis of each dielectric substrate (402a, 402b), a second terminal of the fifth branch (418e, 418e') of each multi-bended microstripline is connected to a first terminal of the phase inverter, and a second terminal of the sixth branch (418f, 418f') of each multi-bended microstripline is connected to a second terminal of the phase inverter.

In an aspect, the hybrid microstripline transmit/receive 400 includes a plurality of tuning capacitors attached to each multi-bended microstripline, wherein a capacitance value of each capacitor is configured to be tuned to adjust the fundamental frequency to match a magnetic resonance frequency of a target atom.

In an aspect, each capacitor of the plurality of tuning capacitors is connected to a respective terminal end of each branch of each multi-bended microstripline, wherein each capacitor has a capacitance value configured to be tuned in a capacitance range of one of zero to 62 pF and zero to 124 pF.

In an aspect, a first capacitor of the plurality of tuning capacitors is connected to the first terminal of the fifth branch of each multi-bended microstripline, a second capacitor of the plurality of tuning capacitors is connected to the first terminal of the fifth branch of each multi-bended microstripline, and a third capacitor of the plurality of tuning capacitors is connected to the intersection of the first terminal of the fifth branch with the first branch at the first central axis. The first capacitor and the second capacitor each have capacitance values configured to be tuned in a capacitance range of zero to 62 pF and the third capacitor has a capacitance value configured to be tuned in a capacitance range of zero to 124 pF.

In an aspect, the capacitance value of each capacitor is zero at a 3T magnetic field strength for the X-atomic nuclei which include $^{1}$H and $^{19}$F atoms for both a transmission mode and a reception mode, the capacitance value of each capacitor at a 3T magnetic field strength is configured to be tuned to adjust the fundamental frequency to match a respective magnetic resonance frequency of the X-atomic nuclei which include $^{31}$P, $^{23}$Na and $^{13}$C atoms in both the transmission and the reception modes, the capacitance value of each capacitor 502a is zero at a 7T magnetic field strength for the X-atomic nuclei which include $^{1}$H, $^{19}$F and $^{31}$P atoms for both the transmission and the reception modes, and the capacitance value of each capacitor at a 7T magnetic field strength is configured to be tuned to adjust the fundamental frequency to match a respective magnetic resonance frequency of the X-atomic nuclei which include $^{23}$Na and $^{13}$C atoms in both the transmission and the reception modes.

In an aspect, the first port is located at a corner of the first dielectric substrate at an intersection of the first edge and the third edge, the second port is located at a corner of the first dielectric substrate at an intersection of the fourth edge and the second edge, the third port is located at a corner of the second dielectric substrate at an intersection of the third edge and the second edge, and the fourth port is located at a corner of the second dielectric substrate at an intersection of the first edge and the fourth edge.

In an aspect, the phase inverter is a 50Ω coaxial cable.

In an aspect, the first multi-bended microstripline includes a first straight leg of the first branch connected to the first port, a first four lobed loop connected to the first straight leg, a second straight leg connected to the first four lobed loop, a third straight leg connected to the second terminal of the first branch, and a second four lobed loop connected between the second straight leg and the third straight leg; a first straight leg of the second branch connected to the first port, a three lobed loop connected to the first straight leg of the second branch, a second straight leg of the second branch connected between the three lobed loop and the first terminal of the fourth branch, wherein the three lobed loop is centered about the second central axis; the third branch connected between the second terminal of the first branch and the second port, wherein the third branch is a mirror image of the first branch about the first central axis; the fourth branch connected between the second straight leg of the second branch and the second port, wherein the fourth branch is a mirror image of the second branch; a straight leg of the fifth branch connected to the intersection of the first branch with the first central axis, a single lobed loop of the fifth branch connected to the straight leg of the fifth branch, the single lobed loop of the fifth branch connected to the phase inverter, wherein the single lobed loop of the fifth branch extends from the first central axis towards the fourth edge, and wherein the single lobed loop of the fifth branch is centered about the second central axis; and a straight leg of the sixth branch connected to the intersection of the fourth branch with the first central axis, a single lobed loop of the sixth branch connected to the straight leg of the sixth branch, the single lobed loop of the sixth branch connected to the phase inverter, wherein the single lobed loop of the sixth branch extends from the first central axis towards the third edge, and wherein the single lobed loop of the sixth branch is centered about the second central axis.

In an aspect, the second multi-bended microstripline comprises a first straight leg of the first branch connected to the first port, a first four lobed loop connected to the first straight leg, a second straight leg connected to the first four lobed loop, a third straight leg connected to the fourth port, and a second four lobed loop connected between the second straight leg and the third straight leg; a first straight leg of the second branch connected to the first port, a three lobed loop connected to the first straight leg of the second branch, a second straight leg of the second branch connected between the three lobed loop and the third port, wherein the three lobed loop is centered about the second central axis; the third branch connected between the fourth port and the second terminal of the fourth branch of the second multi-bended microstripline, wherein the third branch is a mirror image of the first branch about the first central axis; the fourth branch connected between the third port and a second terminal of the third branch, wherein the fourth branch is a mirror image of the second branch; a straight leg of the fifth branch connected to the intersection of the first branch with the first central axis, a single lobed loop of the fifth branch connected to the straight leg of the fifth branch, the single lobed loop of the fifth branch connected to the phase inverter, wherein the single lobed loop of the fifth branch extends from the first central axis towards the fourth edge, and wherein the single lobed loop of the fifth branch is centered about the second central axis; and a straight leg of the sixth branch connected to the intersection of the fourth branch with the first central axis, a single lobed loop of the sixth branch connected to the straight leg of the sixth branch, the single lobed loop of the sixth branch connected to the phase inverter, wherein the single lobed loop of the sixth branch extends from the first central axis towards the third edge, and wherein the single lobed loop of the sixth branch is centered about the second central axis.

In an aspect, three lobed loop of the second branch of each of the first multi-bended microstriplines comprises a first lobe which extends towards the first central axis, a second lobe which extends towards the first edge and a third lobe which extends towards the second edge, wherein the second lobe and the third lobe are mirror images; and each lobe of the three lobed loop of the second branch has a same width and a same length as each other lobe of the three lobed loop.

In an aspect, the first multi-bended microstripline includes the four lobed loop of the second branch of each multi-bended microstripline is centered about a branch axis which extends from the first edge to the second edge and which is located halfway between the first terminal of the second branch and the first central axis, wherein a first lobe of the first four lobed loop extends towards the first central axis a distance A and a second lobe of the first four lobe loop extends towards the first central axis a distance B, where the distance A is about two times the distance B, wherein a third lobe and a fourth lobe of the first four lobed loop of the second branch are mirror images of the first lobe and the second lobe about the branch axis; and the second four lobed loop of the second branch is a mirror image of the first four lobed loop of the second branch about the first central axis.

In another embodiment, a method of using a hybrid microstripline transmit/receive switch for magnetic resonance imaging (MRI) of X-atomic nuclei at 3 tesla (T) and 7T magnetic field strengths is described. The method includes in a transmission mode: forward biasing a first pin diode and a second pin diode, applying, with a power amplifier, electrical signals to a first port of the hybrid microstripline transmit/receive switch, adjusting the magnetic field strength of the electrical signals to one of a 3T magnetic field strength and a 7T magnetic field strength, tuning a capacitance value of each of a plurality of capacitors connected to branches of multi-bended microstriplines which form multi-lobed transmission paths of the hybrid microstripline transmit/receive switch to sweep an operating frequency of the electrical signals over the resonance frequencies of a set of X-nuclei, minimizing interference by connecting a 50Ω terminator to a third port, transmitting the electrical signals at the tuned operating frequency to a radio frequency coil of a magnetic resonance imager from a second port to a target area. The method includes in a reception mode: reverse biasing the first pin diode and the second pin diode, receiving electrical signals emitted from the target area at a fourth port, determining a resonance frequency of the received electrical signals, determining whether the resonance frequency of the received electrical signals matches the resonance frequency of one of the set of X-nuclei. The set of X-nuclei comprises $^{1}$H, $^{19}$F, $^{31}$P, $^{23}$Na and $^{13}$C, and scanning the target area with the electrical signals at the resonance frequency of the matched X-nucleus to generate an image of the target area.

Numerous modifications and variations of the present disclosure are possible in light of the above teachings. It is therefore to be understood that within the scope of the appended claims, the invention may be practiced otherwise than as specifically described herein.

The invention claimed is:

1. A broadband hybrid magnetic coupler for magnetic resonance imaging (MRI) of atomic nuclei, comprising:
   a dielectric substrate having a top side and a bottom side, a first edge opposite to a second edge, a third edge opposite to a fourth edge, wherein a first central axis of the dielectric substrate is configured to bisect the first edge and the second edge and to extend from the first edge to the second edge and wherein a second central axis of the dielectric substrate is configured to bisect the third edge and the fourth edge and to extend from the third edge to the fourth edge;
   a first port, a second port, a third port and a fourth port, wherein each port is configured to connect to a sub-miniature radio frequency (RF) connector located on the bottom side of the dielectric substrate;
   a multi-bended microstripline formed on the dielectric substrate, wherein the multi-bended microstripline has six branches, including:
      a first branch having a multi-bended structure extending between first port and the fourth port and between the third edge and the first central axis, wherein the multi-bended structure of the first branch includes a first straight leg connected to the first port, a second straight leg connected to the fourth port and a three lobed loop connected between the first straight leg and the second straight leg, wherein the three lobed loop is centered about the second central axis;

a second branch extending between the first port and the second port, the second branch comprising a first straight leg connected to the first port, a second straight leg, a first four lobed loop connected between the first straight leg and the second straight leg, a third straight leg connected to the second port, and a second four lobed loop connected between the second straight leg and the third straight leg;

a third branch extending between the second port and the third port, wherein the third branch is a mirror image of the first branch;

a fourth branch extending between the third port and the fourth port, wherein the fourth branch is a mirror image of the second branch;

a phase inverter located at an intersection of the first central axis and the second central axis;

a fifth branch located between an intersection of the second branch with the first central axis and the phase inverter, the fifth branch comprising a straight leg connected to the second branch and a single lobed loop connected to the phase inverter, wherein the single lobed loop extends from the first central axis towards the fourth edge, and wherein the single lobed loop is centered about the second central axis; and a sixth branch located between an intersection of the fourth branch with the first central axis and the phase inverter, the sixth branch comprising a straight leg connected to the fourth branch and a single lobed loop connected to the phase inverter, wherein the single lobed loop extends from the first central axis towards the third edge, and wherein the single lobed loop is centered about the second central axis, wherein each of the microstripline of the first branch and the microstripline of the third branch have a width Wa;

wherein each of the microstriplines of the second branch, the fourth branch, the fifth branch and the sixth branch have a width Wb, where the width Wb equals about seven times the width Wa, wherein the multi-bended microstripline is configured to receive electrical signals at the first port and resonate the electrical signals at frequencies of about 95 MHz and about 285 MHz at the second port and at the fourth port, wherein the frequencies at the fourth port are orthogonal to the frequencies at the second port, and wherein the wherein the third port is isolated.

2. The broadband hybrid magnetic coupler of claim 1, wherein:

the first port is located at a first corner of the dielectric substrate between the first straight leg of the first branch and the first straight leg of the second branch, wherein the first corner is located between the first edge and the third edge;

the second port is located at a second corner of the dielectric substrate between the third straight leg of the second branch and a first straight leg of the third branch, wherein the second corner of is located between the first edge and the fourth edge;

the third port is located at a third corner of the dielectric substrate between a second straight leg of the third branch and a second straight leg of the fourth branch, wherein the third corner is located between the fourth edge and the second edge; and the fourth port is located at a fourth corner of the dielectric substrate between a third straight leg of the fourth branch and the second straight leg of the first branch, wherein the fourth corner is located between the third edge and the second edge.

3. The broadband hybrid magnetic coupler of claim 2, wherein:

the three lobed loop of the first branch includes a first lobe which extends towards the first central axis, a second lobe which extends towards the first edge and a third lobe which extends towards the second edge, wherein the second lobe and the third lobe are mirror images; and each lobe of the three lobed loop of the first branch has a same width and a same length as each other lobe of the three lobed loop.

4. The broadband hybrid magnetic coupler of claim 3, wherein:

the first four lobed loop of the second branch is centered about a branch axis which extends from the first edge to the second edge and which is located halfway between the fourth port and the first central axis, wherein a first lobe of the first four lobed loop extends towards the central axis a distance A and a second lobe of the first four lobe loop extends towards the third edge a distance B, where the distance A is about two times the distance B, wherein a third lobe and a fourth lobe of the first four lobed loop of the second branch are mirror images of the first lobe and the second lobe about the branch axis; and the second four lobed loop of the second branch is a mirror image of the first four lobed loop of the second branch about the first central axis.

5. The broadband hybrid magnetic coupler of claim 4, wherein:

the third branch is a mirror image of the first branch about the first central axis; and the fourth branch is a mirror image of the second branch about the second central axis.

6. A hybrid microstripline transmit/receive switch for use in magnetic resonance imaging (MRI) of X-atomic nuclei at 3T and 7T magnetic field strengths, comprising:

a first dielectric substrate and a second dielectric substrate, wherein each dielectric substrate includes a top side, a bottom side and four corners, a first edge opposite to a second edge, a third edge opposite to a fourth edge, wherein a first central axis of each dielectric substrate is configured to bisect the first edge and the second edge and to extend from the first edge to the second edge and wherein a second central axis of the dielectric substrate is configured to bisect the third edge and the fourth edge and to extend from the third edge to the fourth edge;

a first broadband hybrid magnetic coupler formed on the top side of the first dielectric substrate, wherein the first broadband hybrid magnetic coupler includes a first multi-bended microstripline;

a first ground plane formed on the bottom side of the first dielectric substrate;

a second broadband hybrid magnetic coupler formed on the top side of the second dielectric substrate, wherein the second broadband hybrid magnetic coupler includes a second multi-bended microstripline, wherein second multi-bended microstripline is identical in configuration to the first multi-bended microstripline;

a second ground plane formed on the bottom side of the second dielectric substrate, wherein the second ground plane is attached to the first ground plane;

wherein each multi-bended microstripline includes a first branch, a second branch, a third branch, a fourth branch, a fifth branch and a sixth branch, wherein the fourth branch is a mirror image of the first branch about the second central axis, the third branch is a mirror image of the second branch about the first central axis, and the sixth branch is a mirror image of the fifth branch about the second central axis;

a phase inverter connected between the fifth branch and the sixth branch of each multi-bended microstripline;

a first port, a second port, a third port and a fourth port;

a first terminal of a first branch of the first multi-bended microstripline connected to the first port;

a second terminal of the first branch of the first multi-bended microstripline connected to a first terminal of a first branch of the second multi-bended microstripline;

a first pin diode connected between the second terminal of the first branch of the first multi-bended microstripline and the first ground plane;

a second terminal of the first branch of the second multi-bended microstripline connected to the fourth port;

a first terminal of the second branch of the first multi-bended microstripline connected to the first port;

a second terminal of the second branch of the first multi-bended microstripline connected to a first terminal of the fourth branch of the first multi-bended microstripline;

a microstripline connector configured to connect the first terminal of the fourth branch of the first multi-bended microstripline with the second terminal of the fourth branch of the second multi-bended microstripline;

a second pin diode connected between the first terminal of the fourth branch of the first multi-bended microstripline and the first ground plane;

a second terminal of the third branch of the first multi-bended microstripline connected to a second terminal of the fourth branch of the first multi-bended microstripline, wherein the second port is connected to the second terminal of the fourth branch of the first multi-bended microstripline;

a first terminal of the first branch of the second multi-bended microstripline is connected to the second terminal of the first branch of the first multi-bended microstripline;

a first terminal of the second branch of the second multi-bended microstripline is connected to the first terminal of the first branch of the second multi-bended microstripline;

a second terminal of the second branch of the second multi-bended microstripline is connected to a first terminal of the fourth branch of the second multi-bended microstripline, wherein the third port is connected to the first terminal of the fourth branch of the second multi-bended microstripline; and a 50Ω terminator connected to the third port, wherein the first port is configured to receive a pulsed radio frequency (RF) signal power input and transmit signals to the second port when the first pin diode and the second pin diode are forward biased and to receive signals at the fourth port at the 3T and 7T magnetic field strengths when the first pin diode and the second pin diode are reversed biased, wherein the hybrid microstripline transmit/receive switch is configured to operate in a first broadband frequency range of about 25 MHz to about 55 MH, in a second broadband frequency range of about 61 MHz to about 128 MHz, and in a third broadband frequency range of about 250 MHz to about 317 MHz.

7. The hybrid microstripline transmit/receive switch of claim 6, further comprising:

a sub-miniature radio frequency (RF) connector located on each of the four corners of the dielectric substrate, wherein each port is connected to a respective sub-miniature radio frequency (RF) connector.

8. The hybrid microstripline transmit/receive switch of claim 6, wherein:

the first branch and of the third branch of each multi-bended microstripline each have a width Wa; and the second branch, the fourth branch, the fifth branch and the sixth branch of each multi-bended microstripline have a width Wb, where the width Wb equals about seven times the width Wa.

9. The hybrid microstripline transmit/receive switch of claim 6, wherein:

a first terminal of the fifth branch of each multi-bended microstripline is connected to an intersection of the first branch with the first central axis;

a first terminal of the sixth branch of each multi-bended microstripline is connected to an intersection of the fourth branch with the first central axis;

a second terminal of the fifth branch of each multi-bended microstripline is connected to a first terminal of the phase inverter; and a second terminal of the sixth branch of each multi-bended microstripline is connected to a second terminal of the phase inverter.

10. The hybrid microstripline transmit/receive switch of claim 9, further comprising:

a plurality of tuning capacitors attached to each multi-bended microstripline, wherein a capacitance value of each capacitor is configured to be tuned to adjust the fundamental frequency to match a magnetic resonance frequency of a target atom.

11. The hybrid microstripline transmit/receive switch of claim 10, wherein:

each capacitor of the plurality of tuning capacitors is connected to a respective terminal end of each branch of each multi-bended microstripline, wherein each capacitor has a capacitance value configured to be tuned in a capacitance range of one of zero to 62 pF and zero to 124 pF.

12. The hybrid microstripline transmit/receive switch of claim 11, wherein:

a first capacitor of the plurality of tuning capacitors is connected to the first terminal of the fifth branch of each multi-bended microstripline;

a second capacitor of the plurality of tuning capacitors is connected to the first terminal of the fifth branch of each multi-bended microstripline; and a third capacitor of the plurality of tuning capacitors is connected to the intersection of the first terminal of the fifth branch with the first branch at the first central axis, wherein the first capacitor and the second capacitor each have capacitance values configured to be tuned in a capacitance range of zero to 62 pF and the third capacitor has a capacitance value configured to be tuned in a capacitance range of zero to 124 pF.

13. The hybrid microstripline transmit/receive switch of claim 12, wherein:

the capacitance value of each capacitor is zero at a 3T magnetic field strength for the X-atomic nuclei which include $^1$H and $^{19}$F atoms for both a transmission mode and a reception mode;

the capacitance value of each capacitor at a 3T magnetic field strength is configured to be tuned to adjust the fundamental frequency to match a respective magnetic resonance frequency of the X-atomic nuclei which include $^{31}$P, $^{23}$Na and $^{13}$C atoms in both the transmission and the reception modes;

the capacitance value of each capacitor is zero at a 7T magnetic field strength for the X-atomic nuclei which include $^1$H, $^{19}$F and $^{31}$P atoms for both the transmission and the reception modes; and the capacitance value of each capacitor at a 7T magnetic field strength is configured to be tuned to adjust the fundamental frequency to match a respective magnetic resonance frequency of the X-atomic nuclei which include $^{23}$Na and $^{13}$C atoms in both the transmission and the reception modes.

14. The hybrid microstripline transmit/receive switch of claim 6, wherein:

the first port is located at a corner of the first dielectric substrate at an intersection of the first edge and the third edge;

the second port is located at a corner of the first dielectric substrate at an intersection of the fourth edge and the second edge;

the third port is located at a corner of the second dielectric substrate at an intersection of the third edge and the second edge; and the fourth port is located at a corner of the second dielectric substrate at an intersection of the first edge and the fourth edge.

15. The hybrid microstripline transmit/receive switch of claim 6, wherein the phase inverter is a 50Ω coaxial cable.

16. The hybrid microstripline transmit/receive switch of claim 6, wherein the first multi-bended microstripline comprises:

a first straight leg of the first branch connected to the first port, a first four lobed loop connected to the first straight leg, a second straight leg connected to the first four lobed loop, a third straight leg connected to the second terminal of the first branch, and a second four lobed loop connected between the second straight leg and the third straight leg;

a first straight leg of the second branch connected to the first port, a three lobed loop connected to the first straight leg of the second branch, a second straight leg of the second branch connected between the three lobed loop and the first terminal of the fourth branch, wherein the three lobed loop is centered about the second central axis;

the third branch connected between the second terminal of the first branch and the second port, wherein the third branch is a mirror image of the first branch about the first central axis;

the fourth branch connected between the second straight leg of the second branch and the second port, wherein the fourth branch is a mirror image of the second branch;

a straight leg of the fifth branch connected to the intersection of the first branch with the first central axis, a single lobed loop of the fifth branch connected to the straight leg of the fifth branch, the single lobed loop of the fifth branch connected to the phase inverter, wherein the single lobed loop of the fifth branch extends from the first central axis towards the fourth edge, and wherein the single lobed loop of the fifth branch is centered about the second central axis; and a straight leg of the sixth branch connected to the intersection of the fourth branch with the first central axis, a single lobed loop of the sixth branch connected to the straight leg of the sixth branch, the single lobed loop of the sixth branch connected to the phase inverter, wherein the single lobed loop of the sixth branch extends from the first central axis towards the third edge, and wherein the single lobed loop of the sixth branch is centered about the second central axis.

17. The hybrid microstripline transmit/receive switch of claim 16, wherein the second multi-bended microstripline comprises:

a first straight leg of the first branch connected to the first port, a first four lobed loop connected to the first straight leg, a second straight leg connected to the first four lobed loop, a third straight leg connected to the fourth port, and a second four lobed loop connected between the second straight leg and the third straight leg;

a first straight leg of the second branch connected to the first port, a three lobed loop connected to the first straight leg of the second branch, a second straight leg of the second branch connected between the three lobed loop and the third port, wherein the three lobed loop is centered about the second central axis;

the third branch connected between the fourth port and the second terminal of the fourth branch of the second multi-bended microstripline, wherein the third branch is a mirror image of the first branch about the first central axis;

the fourth branch connected between the third port and a second terminal of the third branch, wherein the fourth branch is a mirror image of the second branch;

a straight leg of the fifth branch connected to the intersection of the first branch with the first central axis, a single lobed loop of the fifth branch connected to the straight leg of the fifth branch, the single lobed loop of the fifth branch connected to the phase inverter, wherein the single lobed loop of the fifth branch extends from the first central axis towards the fourth edge, and wherein the single lobed loop of the fifth branch is centered about the second central axis; and a straight leg of the sixth branch connected to the intersection of the fourth branch with the first central axis, a single lobed loop of the sixth branch connected to the straight leg of the sixth branch, the single lobed loop of the sixth branch connected to the phase inverter, wherein the single lobed loop of the sixth branch extends from the first central axis towards the third edge, and wherein the single lobed loop of the sixth branch is centered about the second central axis.

18. The hybrid microstripline transmit/receive switch of claim 16, wherein the three lobed loop of the second branch of each of the first multi-bended microstriplines comprises:

a first lobe which extends towards the first central axis, a second lobe which extends towards the first edge and a third lobe which extends towards the second edge, wherein the second lobe and the third lobe are mirror images; and each lobe of the three lobed loop of the second branch has a same width and a same length as each other lobe of the three lobed loop.

19. The hybrid microstripline transmit/receive switch of claim 17, wherein:

the four lobed loop of the second branch of each multi-bended microstripline is centered about a branch axis which extends from the first edge to the second edge and which is located halfway between the first terminal of the second branch and the first central axis, wherein a first lobe of the first four lobed loop extends towards the first central axis a distance A and a second lobe of the first four lobe loop extends towards the first central axis a distance B, where the distance A is about two times the distance B, wherein a third lobe and a fourth lobe of the first four lobed loop of the second branch are mirror images of the first lobe and the second lobe about the branch axis; and the second four lobed loop of the second branch is a mirror image of the first four lobed loop of the second branch about the first central axis.

20. A method of using a hybrid microstripline transmit/receive switch for magnetic resonance imaging (MRI) of X-atomic nuclei at 3 tesla (T) and 7T magnetic field strengths, comprising:

in a transmission mode:

forward biasing a first pin diode and a second pin diode;

applying, with a power amplifier, electrical signals to a first port of the hybrid microstripline transmit/re-ceive switch;

adjusting the magnetic field strength of the electrical signals to one of a 3T magnetic field strength and a 7T magnetic field strength;

tuning a capacitance value of each of a plurality of capacitors connected to branches of multi-bended microstriplines which form multi-lobed transmission paths of the hybrid microstripline transmit/receive switch to sweep an operating frequency of the elec-trical signals over the resonance frequencies of a set of X-nuclei;

minimizing interference by connecting a 50Ω termina-tor to a third port;

transmitting the electrical signals at the tuned operating frequency to a radio frequency coil of a magnetic resonance imager from a second port to a target area;

in a reception mode:

reverse biasing the first pin diode and the second pin diode;

receiving electrical signals emitted from the target area at a fourth port;

determining a resonance frequency of the received electrical signals;

determining whether the resonance frequency of the received electrical signals matches the resonance frequency of one of the set of X-nuclei, wherein the set of X-nuclei comprises $^1$H, $^{19}$F, $^{31}$P, $^{23}$Na and $^{13}$C; and scanning the target area with the electrical signals at the resonance frequency of the matched X-nucleus to generate an image of the target area.

* * * * *